(12) United States Patent
Kim et al.

(10) Patent No.: US 10,790,345 B2
(45) Date of Patent: Sep. 29, 2020

(54) DISPLAY DEVICE WITH A BENDING AREA

(71) Applicant: LG Display Co., Ltd., Seoul (KR)

(72) Inventors: Dong-Young Kim, Paju-si (KR);
Kyoung-Nam Lim, Gyeongsangbuk-do (KR); Yu-Ho Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/210,926

(22) Filed: Dec. 5, 2018

(65) Prior Publication Data
US 2019/0189723 A1 Jun. 20, 2019

(30) Foreign Application Priority Data
Dec. 19, 2017 (KR) .......................... 10-2017-0175054

(51) Int. Cl.
*G09G 3/3266* (2016.01)
*H01L 27/32* (2006.01)
(Continued)

(52) U.S. Cl.
CPC ....... *H01L 27/3262* (2013.01); *G09G 3/3266* (2013.01); *G09G 3/3291* (2013.01);
(Continued)

(58) Field of Classification Search
CPC ............. H01L 27/3262; H01L 27/1218; H01L 27/124; H01L 27/1244; H01L 27/3211;
(Continued)

(56) References Cited

U.S. PATENT DOCUMENTS 9,349,758 B2 5/2016 Ki et al.
2010/0182223 A1 7/2010 Choi et al.
(Continued)

FOREIGN PATENT DOCUMENTS

EP 3 051 333 A1 8/2016
EP 3217265 A1 9/2017
(Continued)

OTHER PUBLICATIONS

Korean Intellectual Property Office, Notification of Reason for Refusal, KR Patent Application No. 10-2017-0175054, dated May 20, 2019, 22 pages.
(Continued)

*Primary Examiner* — Lisa S Landis
(74) *Attorney, Agent, or Firm* — Fenwick & West LLP

(57) ABSTRACT

Disclosed is a display device that is capable of being driven with low power consumption. A first thin-film transistor including a polycrystalline semiconductor layer and a second thin-film transistor including an oxide semiconductor layer are disposed in an active area, thereby reducing power consumption. At least one opening formed in a bending area is formed to have the same depth as any one of contact holes formed in the active area, thereby making it possible to form the opening and the contact holes through the same process and consequently simplifying the process of manufacturing the device. A second source electrode of the second thin-film transistor and a second gate electrode of the second thin-film transistor overlap each other with an upper interlayer insulation film interposed therebetween so as to form a first storage capacitor.

28 Claims, 25 Drawing Sheets

(51) Int. Cl.
    *H01L 27/12* (2006.01)
    *H01L 51/00* (2006.01)
    *G09G 3/3291* (2016.01)
    *H01L 51/50* (2006.01)
    *H01L 29/786* (2006.01)

(52) U.S. Cl.
    CPC ........ *H01L 27/124* (2013.01); *H01L 27/1218* (2013.01); *H01L 27/1225* (2013.01); *H01L 27/1244* (2013.01); *H01L 27/1255* (2013.01); *H01L 27/3211* (2013.01); *H01L 27/3246* (2013.01); *H01L 27/3248* (2013.01); *H01L 27/3258* (2013.01); *H01L 27/3265* (2013.01); *H01L 27/3272* (2013.01); *H01L 27/3276* (2013.01); *H01L 29/78633* (2013.01); *H01L 51/0097* (2013.01); *H01L 51/5012* (2013.01); *G09G 2300/0426* (2013.01); *G09G 2300/0452* (2013.01); *G09G 2330/021* (2013.01); *H01L 27/3216* (2013.01); *H01L 27/3218* (2013.01); *H01L 2251/5392* (2013.01)

(58) Field of Classification Search
    CPC ............. H01L 27/3246; H01L 27/3248; H01L 27/3258; H01L 27/3265; H01L 27/3272; H01L 27/3276; H01L 27/32; H01L 27/16; H01L 27/3218; H01L 29/78633; H01L 51/0097; H01L 51/5012; G09G 3/3266; G09G 3/3291; G09G 2300/0426; G09G 2300/0452; G09G 2330/021
    See application file for complete search history.

(56) References Cited

U.S. PATENT DOCUMENTS

| | | | |
|---|---|---|---|
| 2015/0243722 A1* | 8/2015 | Kwon | ................ H01L 27/3262 257/40 |
| 2016/0087022 A1 | 3/2016 | Tsai et al. | |
| 2016/0372497 A1 | 12/2016 | Lee et al. | |
| 2017/0040406 A1 | 2/2017 | Park et al. | |
| 2017/0194411 A1 | 7/2017 | Park et al. | |
| 2017/0262109 A1* | 9/2017 | Choi | ..................... G06F 3/0412 |
| 2017/0263567 A1* | 9/2017 | Moon | ................... H01L 23/585 |
| 2018/0012948 A1* | 1/2018 | Lee | ..................... H01L 27/1225 |

FOREIGN PATENT DOCUMENTS

| | | |
|---|---|---|
| GB | 2540334 A | 1/2017 |
| KR | 10-2013-0069048 A | 6/2013 |
| KR | 10-2014-0099164 A | 8/2014 |
| KR | 10-2015-0101409 A | 9/2015 |
| KR | 10-2015-0101418 A | 9/2015 |
| KR | 10-2016-0027907 A | 3/2016 |
| KR | 10-2016-0043327 A | 4/2016 |
| KR | 10-2016-0093202 A | 8/2016 |
| KR | 10-2017-0080223 A | 7/2017 |
| KR | 10-2017-0106621 A | 9/2017 |
| KR | 10-2017-0114029 A | 10/2017 |
| KR | 10-2017-0136484 A | 12/2017 |
| TW | I602306 B | 10/2017 |

OTHER PUBLICATIONS

The German Patent and Trade Mark Office, Office Action, DE Patent Application No. 10 2018 130 713.6, May 31, 2019, dated 12 pages (with concise explanation of relevance).
The Intellectual Property Office of the United Kingdom, Combined Search and Examination Report under Sections 17 and 18(3), GB Patent Application No. 1820722.5, dated May 30, 2019, eight pages.
Japan Patent Office, Notice of Reasons for Rejection, JP Patent Application No. 2018-233191, dated Dec. 10, 2019, seven pages.
Intellectual Property Office of the United Kingdom, Examination Report, GB Application No. 1820722.5, dtaed Mar. 2, 2020, three pages.
Japan Patent Office, Notice of Reasons for Refusal, JP Patent Application No. 2018-233191, dated Jun. 23, 2020, 11 pages.

* cited by examiner

DISPLAY DEVICE WITH A BENDING AREA

CROSS-REFERENCE TO RELATED APPLICATIONS

This application claims priority to Republic of Korea Patent Application No. 10-2017-0175054, filed on Dec. 19, 2017 in the Korean Intellectual Property Office, the disclosure of which is incorporated herein by reference in its entirety.

BACKGROUND

Field of the Technology

The present disclosure relates to a display device, and more particularly to a display device that is capable of being driven with low power consumption.

Discussion of the Related Art

An image display device, which displays various kinds of information on a screen, is a core technology of the information and communication age and is currently being developed with the aims of realizing a thinner and lighter design, greater portability, and higher performance. Hence, flat panel display devices, which overcome the disadvantageously great weight and volume of a cathode ray tube (CRT), are in the spotlight.

Examples of flat panel display devices include liquid crystal display (LCD) devices, plasma display panel (PDP) devices, organic light-emitting display (OLED) devices, and electrophoretic display (ED) devices.

In recent years, personal electronic devices, to which the above flat panel display devices are applied, have been actively developed in the direction of becoming more portable and/or wearable. These portable or wearable devices require display devices that are capable of being driven with low power consumption. However, it is difficult to manufacture display devices capable of being driven with low power consumption using current technology.

SUMMARY

Accordingly, the present disclosure is directed to a display device that substantially obviates one or more problems due to limitations and disadvantages of the related art.

An object of the present disclosure is to provide a display device that is capable of being driven with low power consumption.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims thereof, as well as the appended drawings.

To achieve these objects and other advantages and in accordance with the purpose of the disclosure, as embodied and broadly described herein, there is provided a display device, in which a first thin-film transistor including a polycrystalline semiconductor layer and a second thin-film transistor including an oxide semiconductor layer are disposed in an active area, thereby reducing power consumption, in which at least one opening formed in a bending area is formed to have the same depth as any one of contact holes formed in the active area, thereby making it possible to form the opening and the contact holes through the same process and consequently simplifying the process of manufacturing the device, and in which a second source electrode of the second thin-film transistor and a second gate electrode of the second thin-film transistor overlap each other with an upper interlayer insulation film interposed therebetween so as to form a first storage capacitor.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this application, illustrate embodiment(s) of the disclosure, and together with the description serve to explain the principle of the disclosure.

DETAILED DESCRIPTION

Reference will now be made in detail to the preferred embodiments of the present disclosure, examples of which are illustrated in the accompanying drawings.

Figure 1:
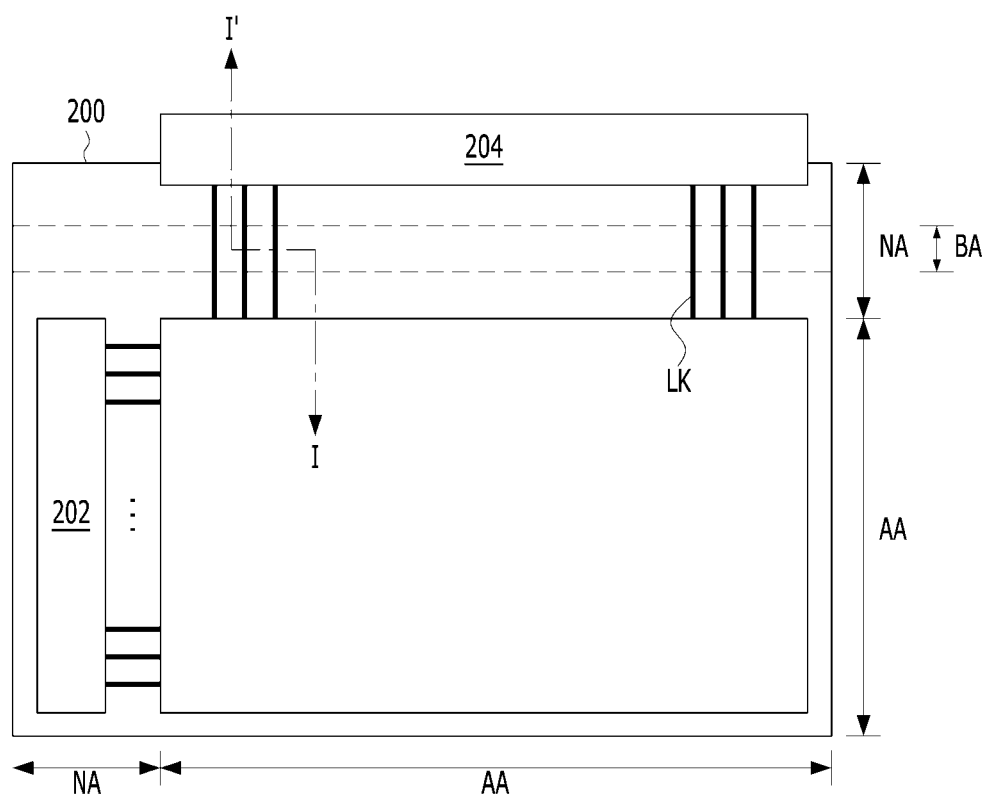
FIG. 1 is a plan view illustrating a display device according to one embodiment of the present disclosure.
Figure 2:
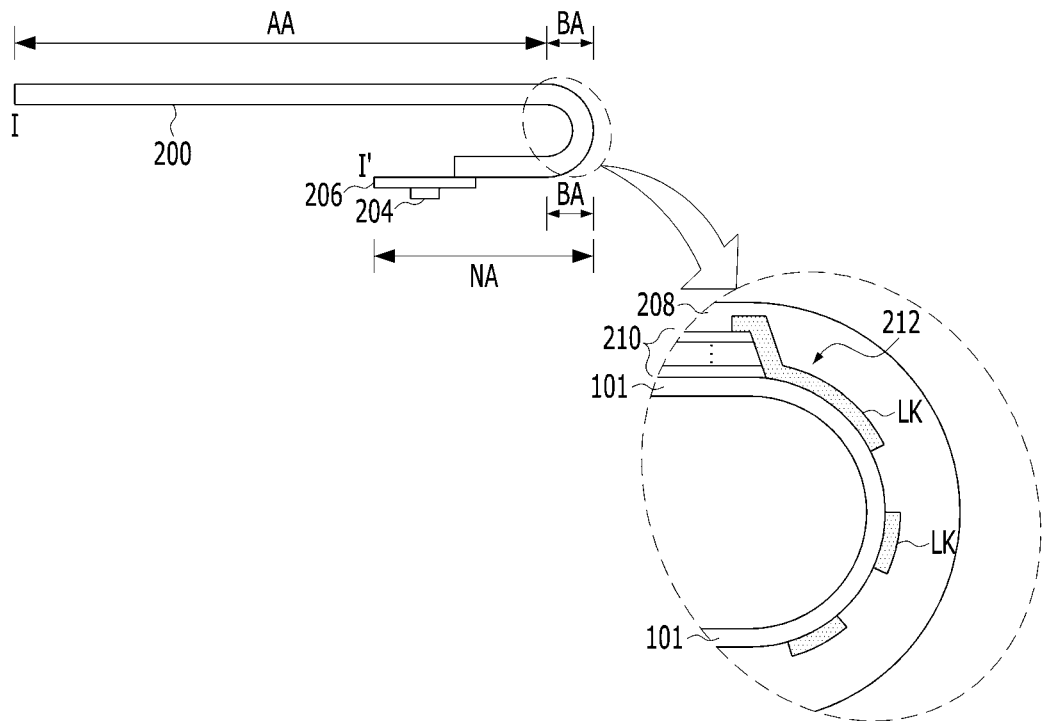
FIG. 2 is a cross-sectional view taken along line I-I' in the display device shown in FIG. 1 according to one embodiment of the present disclosure.

FIG. 1 is a plan view of a display device according to the present disclosure, and FIG. 2 is a cross-sectional view of the display device according to the present disclosure.

The display device shown in FIGS. 1 and 2 includes a display panel 200, a gate-driving unit 202, and a data-driving unit 204.

The display panel 200 is divided into an active area AA provided on a substrate 101 and a non-active area NA provided around the active area AA. The substrate 101 is formed of a plastic material having flexibility so as to be bendable. The substrate is formed of a material such as, for example, polyimide (PI), polyethylene terephthalate (PET), polyethylene naphthalate (PEN), PC (polycarbonate), polyethersulfone (PES), polyarylate (PAR), polysulfone (PSF), cyclic-olefin copolymer (COC), or the like.

Figure 3A:
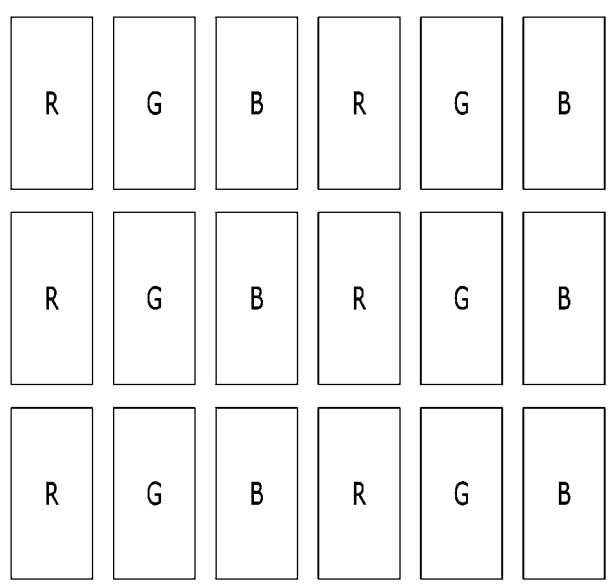
FIGS. 3A and 3B are plan views illustrating sub-pixels disposed in the active area shown in FIG. 1 according to one embodiment of the present disclosure.
Figure 3B:
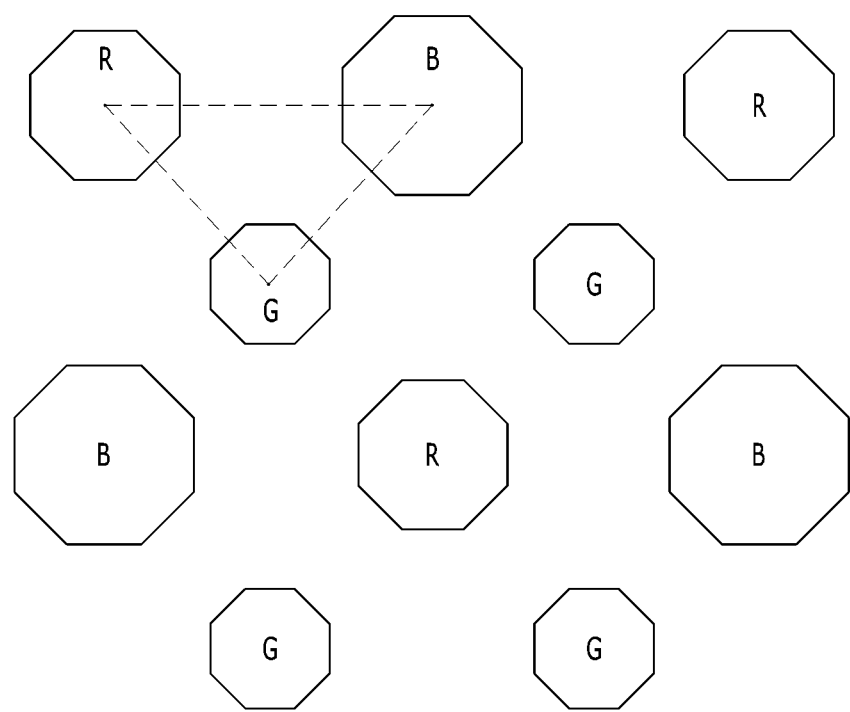

The active area AA displays an image through unit pixels arranged in a matrix form. Each of the unit pixels includes a red (R) sub-pixel, a green (G) sub-pixel, and a blue (B) sub-pixel or includes a red (R) sub-pixel, a green (G) sub-pixel, a blue (B) sub-pixel, and a white (W) sub-pixel. For example, as shown in FIG. 3A, the red (R) sub-pixel, the green (G) sub-pixel, and the blue (B) sub-pixel may be arranged in a row along the same horizontal line. Alternatively, as shown in FIG. 3B, the red (R) sub-pixel, the green (G) sub-pixel and the blue (B) sub-pixel may be spaced apart from each other so as to be arranged in the form of a triangle.

Each sub-pixel includes at least one of a thin-film transistor including an oxide semiconductor layer or a thin-film transistor including a polycrystalline semiconductor layer. A thin-film transistor including an oxide semiconductor layer and a thin-film transistor including a polycrystalline semiconductor layer have higher electron mobility than a thin-film transistor including an amorphous semiconductor layer and are therefore capable of providing high resolution and of being driven with low power.

At least one of the data-driving unit 204 or the gate-driving unit 202 may be disposed in the non-active area NA.

The gate-driving unit 202 drives a scan line of the display panel 200. The gate-driving unit 202 is embodied using at least one of a thin-film transistor including an oxide semiconductor layer or a thin-film transistor including a polycrystalline semiconductor layer. At this time, the thin-film transistor of the gate-driving unit 202 is formed simultaneously with at least one thin-film transistor disposed in each sub-pixel in the active area AA during the same process.

Figure 4A:
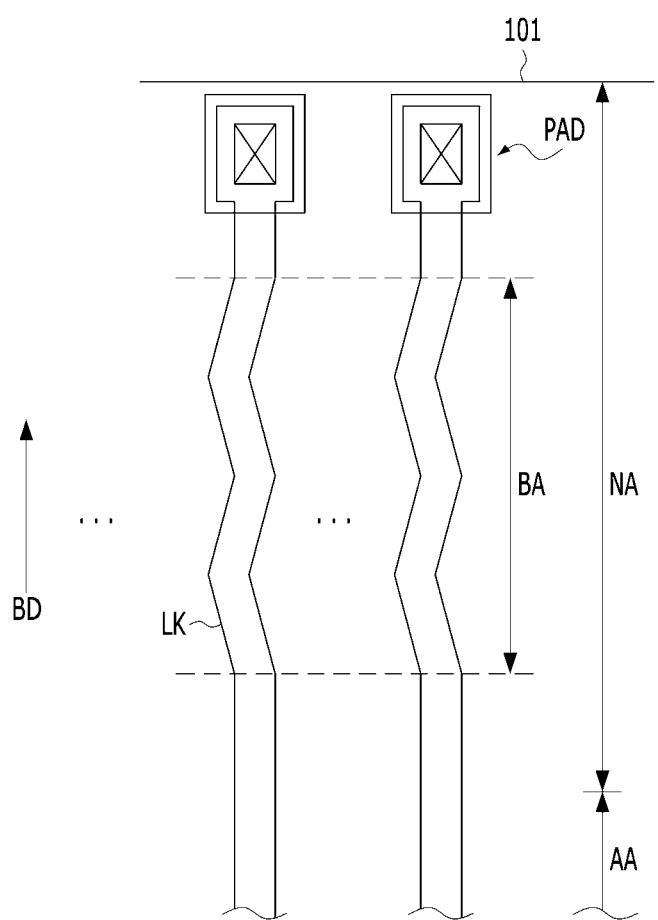
FIGS. 4A and 4B are plan views illustrating embodiments of a signal link disposed in the bending area shown in FIG. 1 according to one embodiment of the present disclosure.
Figure 4B:
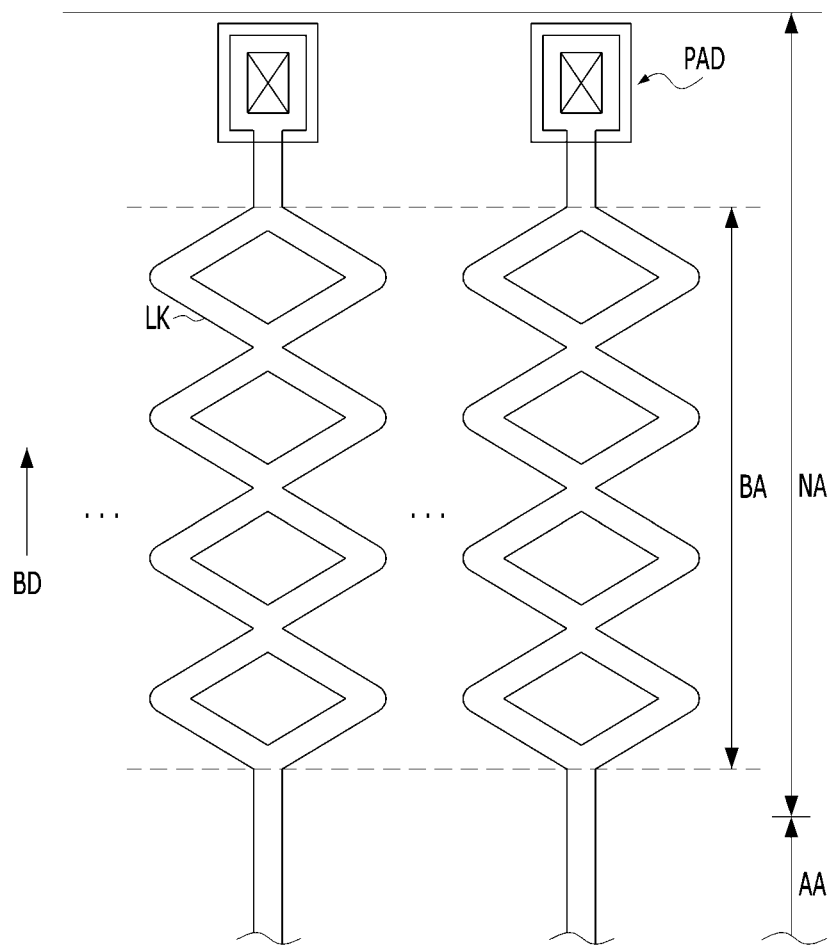

The data-driving unit 204 drives a data line of the display panel 200. The data-driving unit 204 is attached to the non-active area NA by being mounted on the substrate 101 in a chip form or by being mounted on a signal transmission film 206 in a chip form. As shown in FIGS. 4A and 4B, a plurality of signal pads PAD is disposed in the non-active area NA for electrical connection with the signal transmission film 206. Driving signals, which are generated from the data-driving unit 204, the gate-driving unit 202, a power source (not shown), and a timing controller (not shown), are supplied to a signal line disposed in the active area AA through the signal pads PAD.

The non-active area NA includes a bending area BA for bending or folding the display panel 200. The bending area BA is an area that is bent so that the components such as the signal pads PAD, the gate-driving unit 202 and the data-driving unit 204, which do not function to display, are located at the bottom surface of the active area AA. The bending area BA, as shown in FIG. 1, is located in the upper portion of the non-active area NA, which corresponds to a region between the active area AA and the data-driving unit 204. Alternatively, the bending area BA may be located in at least one of the upper portion, the lower portion, the left portion, or the right portion of the non-active area NA. Accordingly, in the entire screen of the display device, the area occupied by the active area AA is maximized, and the area occupied by the non-active area NA is minimized.

A signal link LK is disposed in the bending area BA in order to connect each of the signal pads PAD with a corresponding one of the signal lines disposed in the active area AA. In the case in which the signal link LK is formed in the shape of a straight line that extends in a bending direction BD, the signal link LK may undergo the largest bending stress, and thus a crack or short-circuit may be formed in the signal link LK. In order to prevent this problem, the signal link LK of the present disclosure is formed such that the width thereof in a direction perpendicular to the bending direction BD is increased so as to minimize the bending stress that is applied thereto. To this end, as shown in FIG. 4A, the signal link LK is formed in a zigzag shape or a sine wave shape. Alternatively, as shown in FIG. 4B, the signal link LK is formed such that a plurality of diamond shapes, each having a hollow center portion, is arranged in a row while being connected to each other.

In addition, as shown in FIG. 2, the bending area BA has therein at least one opening 212 for facilitating bending of the bending area BA. The opening 212 is formed by eliminating a plurality of inorganic insulation layers 210 from the bending area BA, which cause cracking in the active area AA. When the substrate 101 is bent, bending stress is continuously applied to the inorganic insulation layers 210 disposed in the bending area BA. The inorganic insulation layers 210 are less elastic than an organic insulation material, and are thus vulnerable to cracking. The cracks formed in the inorganic insulation layers 210 spread to the active area AA via the inorganic insulation layers 210, leading to defects in the lines and malfunction of the elements. In order to prevent this problem, at least one planarization layer 208, which is formed of an organic insulation material that is more elastic than the inorganic insulation layers 210, is disposed in the bending area BA. The planarization layer 208 functions to mitigate bending stress that occurs when the substrate 101 is bent, thereby preventing the occurrence of cracks. The opening 212 formed in the bending area BA is formed through the same mask process as at least one of a plurality of contact holes formed in the active area AA, whereby the structure and the manufacturing process of the display device are simplified.

This display device, which can be simplified in structure and manufacturing process, is applicable to a display device that requires a thin-film transistor, such as a liquid crystal display device, an organic light-emitting display device, or the like. Hereinafter, a description of the embodiment of the present disclosure will be made. The following description is given on the assumption that the above-described display device, which can be simplified in structure and manufacturing process, is an organic light-emitting display device, by way of example.

Figure 5A:
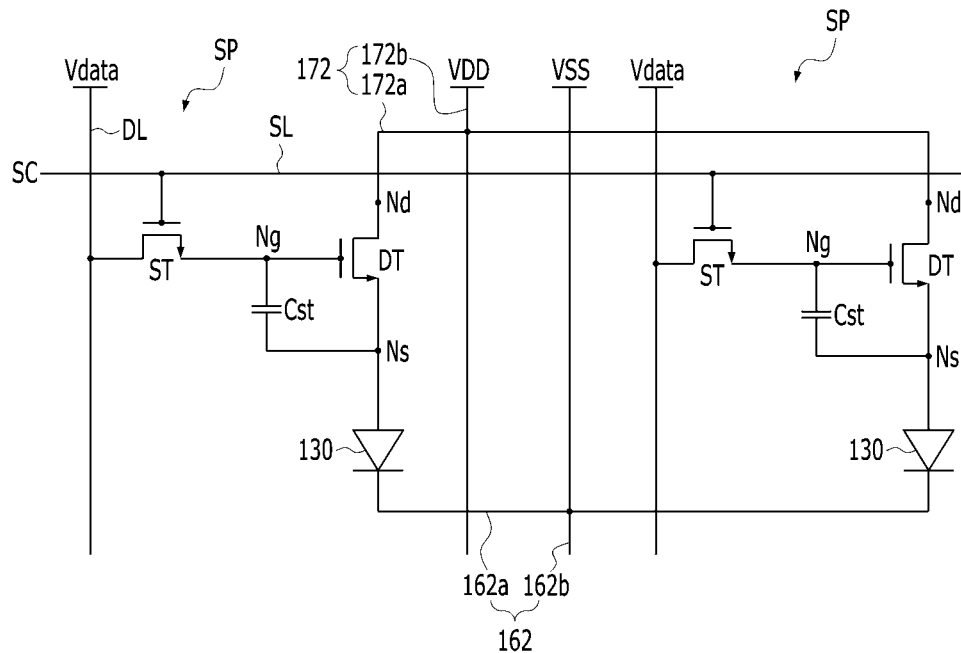
FIGS. 5A and 5B are circuit diagrams for explaining each sub-pixel of the display device shown in FIG. 1 according to one embodiment of the present disclosure.
Figure 5B:
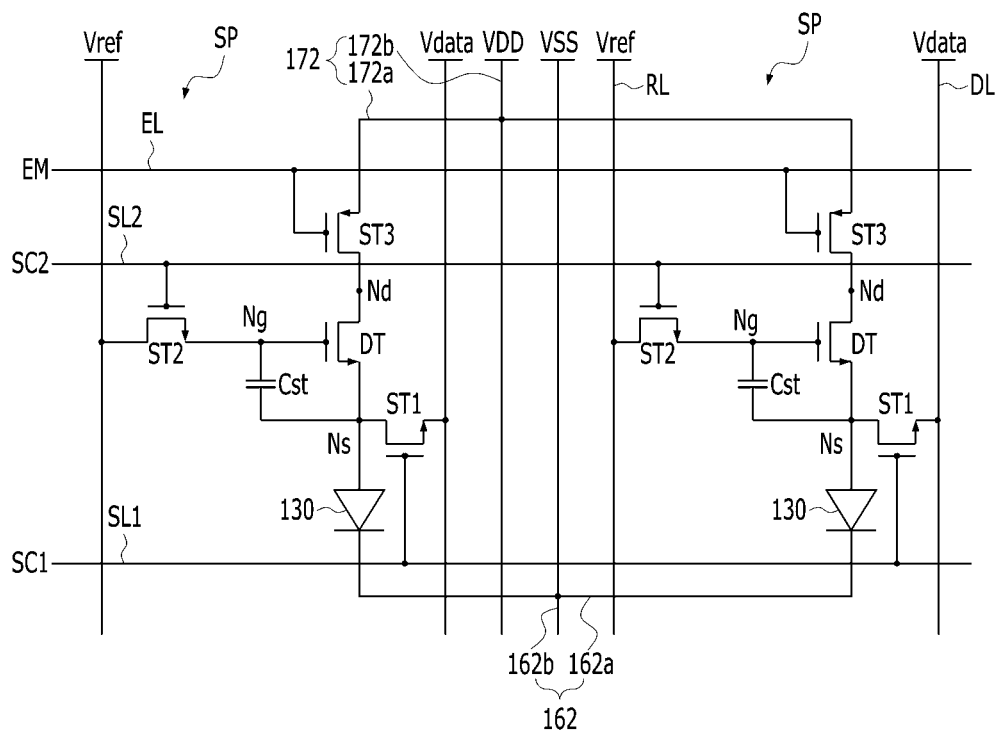

As shown in FIGS. 5A and 5B, in the organic light-emitting display device, each of the sub-pixels SP includes a pixel-driving circuit and a light-emitting element 130, which is connected with the pixel-driving circuit.

Figure 6:
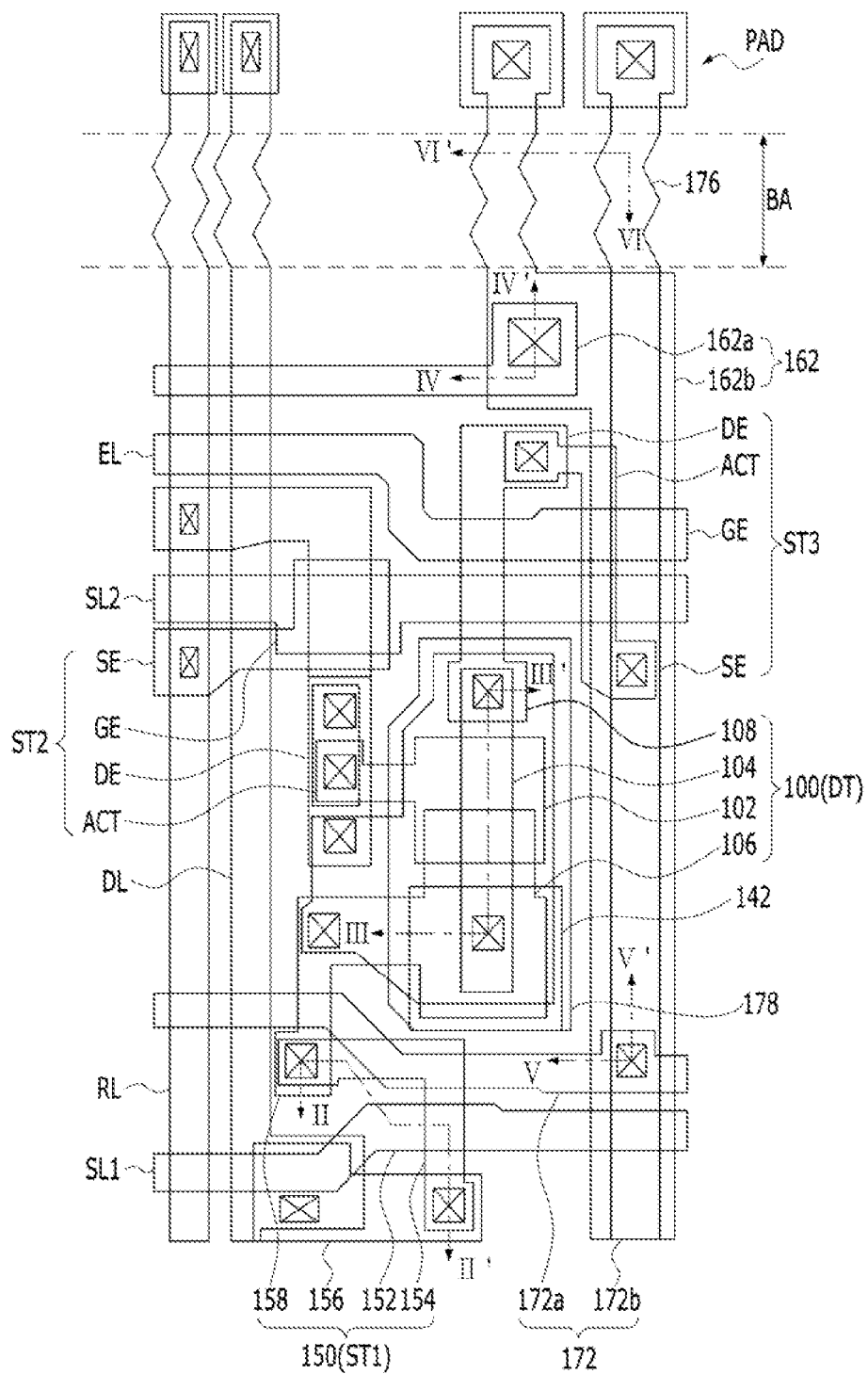
FIG. 6 is a plan view illustrating the sub-pixel shown in FIG. 5B according to one embodiment of the present disclosure.

As shown in FIG. 5A, the pixel-driving circuit has a 2T1C structure that includes two thin-film transistors ST and DT and one storage capacitor Cst. Alternatively, as shown in FIGS. 5B and 6, the pixel-driving circuit has a 4T1C structure that includes four thin-film transistors ST1, ST2, ST3 and DT and one storage capacitor Cst. However, the structure of the pixel-driving circuit is not limited to the aforementioned structures shown in FIGS. 5A and 5B, but the pixel-driving circuit may have various other structures.

In the pixel-driving circuit shown in FIG. 5A, the storage capacitor Cst connects a gate node Ng and a source node Ns to maintain a substantially constant voltage between the gate node Ng and the source node Ns during the light-emitting operation. There is provided a driving transistor DT, which includes a gate electrode, which is connected to the gate node Ng, a drain electrode, which is connected to the drain node Nd, and a source electrode, which is connected to the light-emitting element 130. The driving transistor DT controls the magnitude of the driving current in response to the voltage between the gate node Ng and the source node Ns. There is further provided a switching transistor ST, which includes a gate electrode, which is connected to a scan line SL, a drain electrode, which is connected to a data line DL, and a source electrode, which is connected to the gate node Ng. The switching transistor ST is turned on in response to a scan control signal SC from the scan line SL, and supplies data voltage Vdata from the data line DL to the gate node Ng. The light-emitting element 130 connects the source node Ns, which is connected to the source electrode of the driving transistor DT, to a low potential supply line 162 to emit light in response to the driving current.

The pixel-driving circuit shown in FIG. 5B has substantially the same construction as the pixel-driving circuit shown in FIG. 5A, except that a source electrode of a first switching transistor ST1 connected with the data line DL is connected to the source node Ns and that a second and a third switching transistors ST2 and ST3 are further provided. A duplicate explanation of the same components will be omitted.

The first switching transistor ST1 shown in FIGS. 5B and 6 includes a gate electrode 152, which is connected to a first scan line SL1, a drain electrode 158, which is connected to the data line DL, a source electrode 156, which is connected to the source node Ns, and a semiconductor layer 154, which forms a channel between the source electrode 156 and the drain electrode 158. The first switching transistor ST1 is turned on in response to a scan control signal SC1 from the first scan line SL1, and supplies data voltage Vdata from the data line DL to the source node Ns.

The second switching transistor ST2 includes a gate electrode GE, which is connected to a second scan line SL2, a drain electrode DE, which is connected to a reference line RL, a source electrode SE, which is connected to the gate node Ng, and a semiconductor layer ACT, which forms a channel between the source electrode SE and the drain electrode DE. The second switching transistor ST2 is turned on in response to a scan control signal SC2 from the second scan line SL2, and supplies a reference voltage Vref from the reference line RL to the gate node Ng.

The third switching transistor ST3 includes a gate electrode GE, which is connected to a light emission control line EL, a drain electrode DE, which is connected to a high potential supply line 172, a source electrode SE, which is connected to the drain node Nd, and a semiconductor layer ACT, which forms a channel between the source electrode SE and the drain electrode DE. The third switching transistor ST3 is turned on in response to a light emission control signal EN from the light emission control line EL, and supplies a high potential voltage VDD from the high potential supply line 172 to the drain node Nd.

Each of the high potential supply line 172 and the low potential supply line 162, which are included in the pixel-driving circuit, is formed in a mesh shape so that at least two sub-pixels share the same supply lines. To this end, the high potential supply line 172 includes a first high potential supply line 172a and a second high potential supply line 172b, which intersect each other, and the low potential supply line 162 includes a first low potential supply line 162a and a second low potential supply line 162b, which intersect each other.

The second high potential supply line 172b and the second low potential supply line 162b are arranged parallel to the data line DL. One second high potential supply line 172b is provided for at least two sub-pixels. One second low potential supply line 162b is provided for at least two sub-pixels. As shown in FIGS. 5A and 5B, the second high potential supply line 172b and the second low potential supply line 162b are arranged parallel to each other in the lateral direction. Alternatively, as shown in FIG. 6, the second high potential supply line 172b and the second low potential supply line 162b are arranged parallel to each other in the vertical direction so as to overlap each other.

The first high potential supply line 172a is electrically connected to the second high potential supply line 172b, and is arranged parallel to the scan line SL. The first high potential supply line 172a diverges from the second high potential supply line 172b. The first high potential supply line 172a compensates for the resistance of the second high potential supply line 172b, whereby the voltage drop (IR drop) of the high potential supply line 172 is minimized.

The first low potential supply line 162a is electrically connected to the second low potential supply line 162b, and is arranged parallel to the scan line SL. The first low potential supply line 162a diverges from the second low potential supply line 162b. The first low potential supply line 162a compensates for the resistance of the second low potential supply line 162b, whereby the voltage drop (IR drop) of the low potential supply line 162 is minimized.

As such, each of the high potential supply line 172 and the low potential supply line 162 is formed in a mesh shape. Therefore, the number of second high potential supply lines 172b and second low potential supply lines 162b, which are arranged in the vertical direction, may be reduced, and a larger number of sub-pixels may be disposed due to the reduced number of second high potential supply lines 172b and second low potential supply lines 162b, so that the aperture ratio and the resolution of the device are increased.

Figure 7:
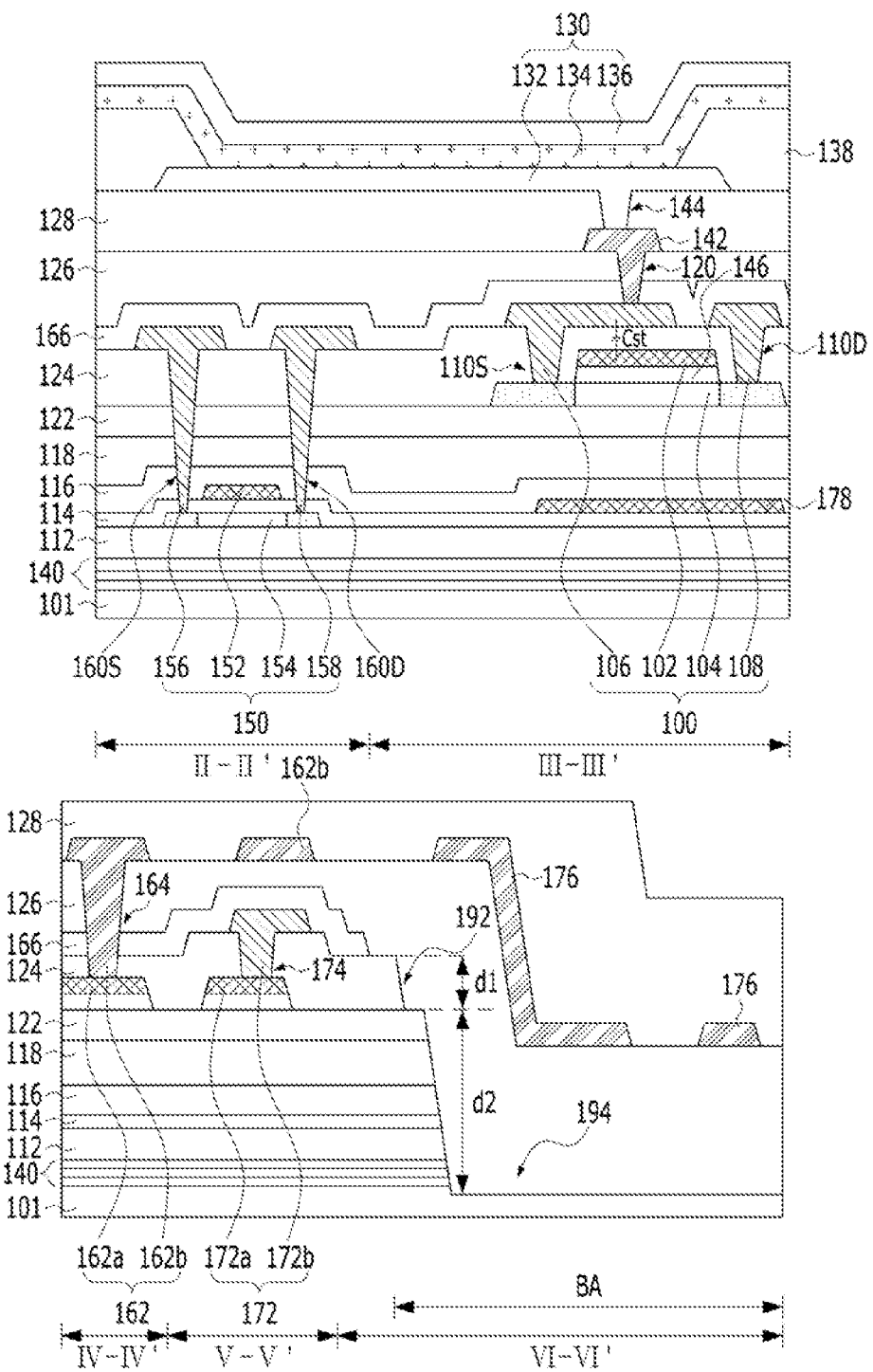
FIG. 7 is a cross-sectional view taken along lines II-II', III-III', IV-IV', V-V' and VI-VI' in the organic light-emitting display device shown in FIG. 6 according to one embodiment of the present disclosure.

One of the transistors included in the pixel-driving circuit includes a polycrystalline semiconductor layer, and one of the remaining transistors includes an oxide semiconductor layer. As shown in FIG. 7, the switching transistor ST of the pixel-driving circuit shown in FIG. 5A is embodied by a first thin-film transistor 150 including a polycrystalline semiconductor layer 154, and the driving transistor DT is embodied by a second thin-film transistor 100 including an oxide semiconductor layer 104. Each of the first switching transistor ST1 and the third switching transistor ST3 of the pixel-driving circuits shown in FIGS. 5B and 6 is embodied by a first thin-film transistor 150 including a polycrystalline semiconductor layer 154, and each of the second switching transistor ST2 and the driving transistor DT is embodied by a second thin-film transistor 100 including an oxide semiconductor layer 104. As such, according to the present disclosure, the second thin-film transistor 100 including the oxide semiconductor layer 104 is applied to the driving transistor DT of each sub-pixel, and the first thin-film transistor 150 including the polycrystalline semiconductor layer 154 is applied to the switching transistor ST of each sub-pixel, whereby power consumption is reduced.

The first thin-film transistor 150 shown in FIGS. 6 and 7 includes the polycrystalline semiconductor layer 154, the first gate electrode 152, the first source electrode 156, and the first drain electrode 158.

The polycrystalline semiconductor layer 154 is formed on a lower buffer layer 112. The polycrystalline semiconductor layer 154 includes a channel region, a source region, and a drain region. The channel region overlaps the first gate electrode 152, with a lower gate insulation film 114 interposed between, and is formed between the first source electrode 156 and the first drain electrode 158. The source region is electrically connected to the first source electrode 156 through a first source contact hole 160S. The drain region is electrically connected to the first drain electrode 158 through a first drain contact hole 160D. The polycrystalline semiconductor layer 154 has higher mobility than the amorphous semiconductor layer, thereby exhibiting low energy/power consumption and improved reliability. Therefore, the polycrystalline semiconductor layer 154 is suitable for application to the switching transistor ST of each subpixel and the gate-driving unit 202 for driving the scan line SL. A multi-buffer layer 140 and the lower buffer layer 112 are disposed between the polycrystalline semiconductor layer 154 and the substrate 101. The multi-buffer layer 140 impedes the diffusion of moisture and/or oxygen that has permeated the substrate 101. The multi-buffer layer 140 is formed in a manner such that silicon nitride (SiNx) and silicon oxide (SiOx) are alternately stacked. The lower buffer layer 112 functions to protect the polycrystalline semiconductor layer 154 by interrupting the spread of various kinds of defects from the substrate 101. The lower buffer layer 112 may be formed of a-Si, silicon nitride (SiNx), silicon oxide (SiOx), or the like.

The first gate electrode 152 is formed on the lower gate insulation film 114. The first gate electrode 152 overlaps the channel region of the polycrystalline semiconductor layer 154, with the lower gate insulation film 114 interposed therebetween. The first gate electrode 152 may be a single layer or multiple layers formed of the same material as a lower storage electrode, for example, any one selected from the group consisting of molybdenum (Mo), aluminum (Al), chrome (Cr), gold (Au), titanium (Ti), nickel (Ni), neodymium (Nd), and copper (Cu), or an alloy thereof. However, the disclosure is not limited thereto.

First lower interlayer insulation film 116 and second lower interlayer insulation film 118, which are located on the polycrystalline semiconductor layer 154, are configured as inorganic films that have higher hydrogen particle content than an upper interlayer insulation film 124. For example, the first lower interlayer insulation film 116 and the second lower interlayer insulation film 118 are formed of silicon nitride (SiNx) through a deposition process using ammonia (NH3) gas, and the upper interlayer insulation film 124 is formed of silicon oxide (SiOx). The hydrogen particles contained in the first lower interlayer insulation film 116 and the second lower interlayer insulation film 118 diffuse into the polycrystalline semiconductor layer 154 during a hydrogenation process, thereby allowing pores in the polycrystalline semiconductor layer 154 to be filled with hydrogen. Accordingly, the polycrystalline semiconductor layer 154 is stabilized, thus preventing deterioration of the properties of the first thin-film transistor 150.

The first source electrode 156 is connected to the source region of the polycrystalline semiconductor layer 154 through a first source contact hole 160S that penetrates the lower gate insulation film 114, the first lower interlayer insulation film 116 and the second lower interlayer insulation film 118, an upper buffer layer 122, and the upper interlayer insulation film 124. The first drain electrode 158 faces the first source electrode 156 and is connected to the drain region of the polycrystalline semiconductor layer 154 through a first drain contact hole 160D that penetrates the lower gate insulation film 114, the first lower interlayer insulation film 116 and the second lower interlayer insulation film 118, the upper buffer layer 122, and the upper interlayer insulation film 124. Since the first source electrode 156 and the first drain electrode 158 are positioned in the same plane and are formed of the same material as a storage supply line (not shown), the first source electrode 156, the first drain electrode 158 and the storage supply line (not shown) may be formed at the same time through the same mask process.

After the activation and hydrogenation processes of the polycrystalline semiconductor layer 154 of the first thin-film transistor 150, the oxide semiconductor layer 104 of the second thin-film transistor 100 is formed. That is, the oxide semiconductor layer 104 is disposed on the polycrystalline semiconductor layer 154. Accordingly, the oxide semiconductor layer 104 is not exposed to the high-temperature conditions of the activation and hydrogenation processes of the polycrystalline semiconductor layer 154, thereby preventing damage to the oxide semiconductor layer 104 and therefore improving reliability.

The second thin-film transistor 100 is disposed on the substrate 101 so as to be spaced apart from the first thin-film transistor 150. The second thin-film transistor 100 includes a second gate electrode 102, the oxide semiconductor layer 104, a second source electrode 106, and a second drain electrode 108.

The second gate electrode 102 overlaps the oxide semiconductor layer 104 with an upper gate insulation pattern 146 interposed therebetween. The second gate electrode 102 is formed in the same plane as the first high potential supply line 172a. That is, it is formed on the upper gate insulation pattern 146 using the same material as the first high potential supply line 172a. Accordingly, the second gate electrode 102 and the first high potential supply line 172a may be formed through the same mask process, and therefore the number of mask processes may be reduced.

The oxide semiconductor layer 104 is formed on the upper buffer layer 122 so as to overlap the second gate electrode 102, thereby forming a channel between the second source electrode 106 and the second drain electrode 108. The oxide semiconductor layer 104 is formed of oxide including at least one metal selected from the group consisting of Zn, Cd, Ga, In, Sn, Hf, and Zr. Since the second thin-film transistor 100 including this oxide semiconductor layer 104 has higher electron mobility and lower off-current than the first thin-film transistor 150 including the polycrystalline semiconductor layer 154, it is suitable for application to the switching and driving thin-film transistors ST and DT, in which an On-time period is short but an Off-time period is long.

The upper interlayer insulation film 124 and the upper buffer layer 122, which are disposed adjacent to the upper side and the lower side of the oxide semiconductor layer 104, are configured as inorganic films that have lower hydrogen particle content than the lower interlayer insulation films 116 and 118. For example, the upper interlayer insulation film 124 and the upper buffer layer 122 are formed of silicon oxide (SiOx), and the lower interlayer insulation films 116 and 118 are formed of silicon nitride (SiNx). Accordingly, it is possible to prevent hydrogen contained in the lower interlayer insulation films 116 and 118 and hydrogen contained in the polycrystalline semiconductor layer 154 from being diffused to the oxide semiconductor layer 104 during a heat treatment process performed on the oxide semiconductor layer 104.

Each of the second source electrode 106 and the second drain electrode 108 may be a single layer or multiple layers formed on the upper interlayer insulation film 124, and may be formed of any one selected from the group consisting of molybdenum (Mo), aluminum (Al), chrome (Cr), gold (Au), titanium (Ti), nickel (Ni), neodymium (Nd), and copper (Cu), or an alloy thereof. However, the disclosure is not limited thereto.

The second source electrode 106 is connected to the source region of the oxide semiconductor layer 104 through a second source contact hole 110S that penetrates the upper interlayer insulation film 124. The second drain electrode 108 is connected to the drain region of the oxide semiconductor layer 104 through a second drain contact hole 110D that penetrates the upper interlayer insulation film 124. The second source electrode 106 and the second drain electrode 108 are formed so as to face each other with the channel region of the oxide semiconductor layer 104 interposed between.

As shown in FIG. 7, the storage capacitor Cst is formed in a manner such that the gate electrode 102 of the driving transistor and the source electrode 106 of the driving transistor overlap each other with the upper interlayer insulation film 124 interposed between.

Figure 8A:
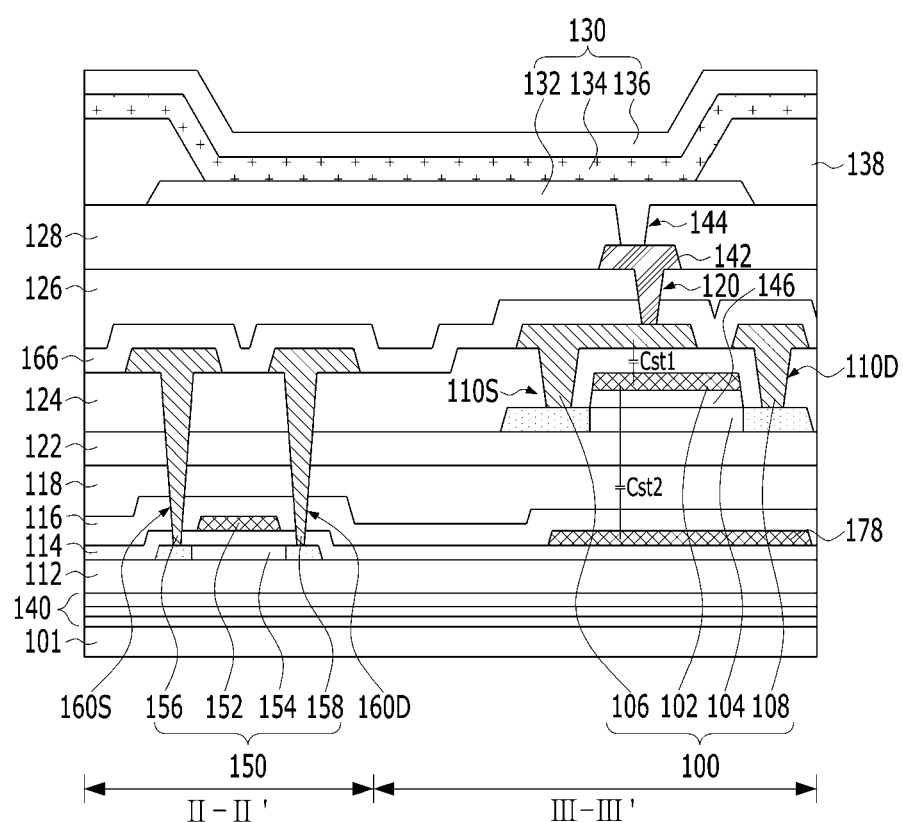
FIGS. 8A to 8C are cross-sectional views illustrating other embodiments of the storage capacitor shown in FIG. 7.
Figure 8B:
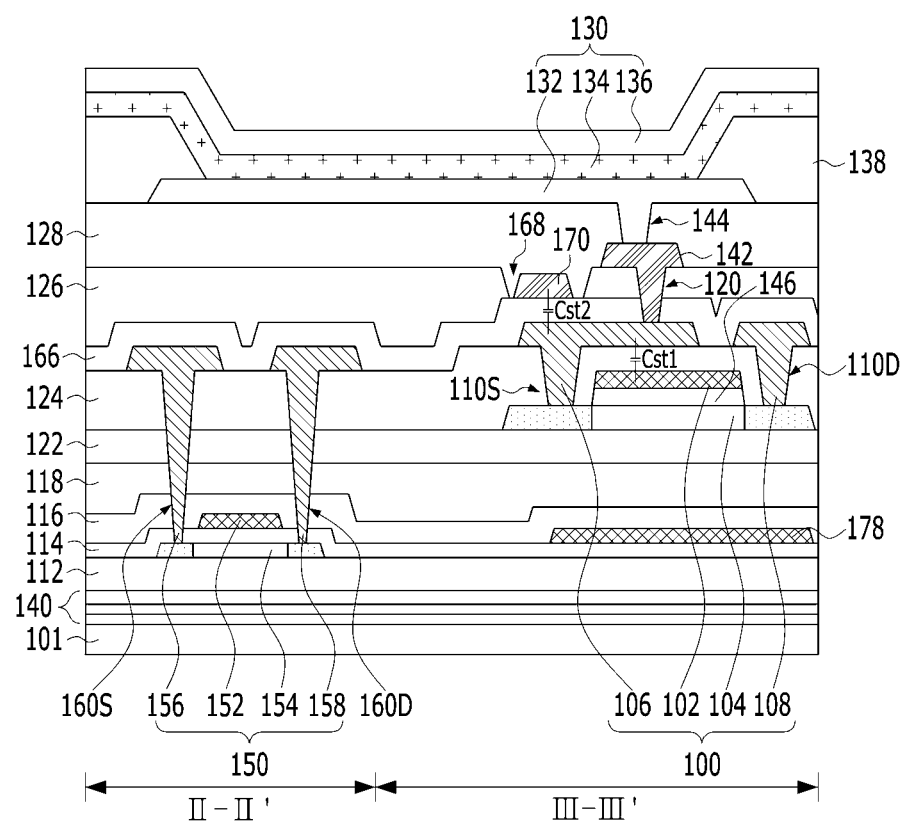
Figure 8C:
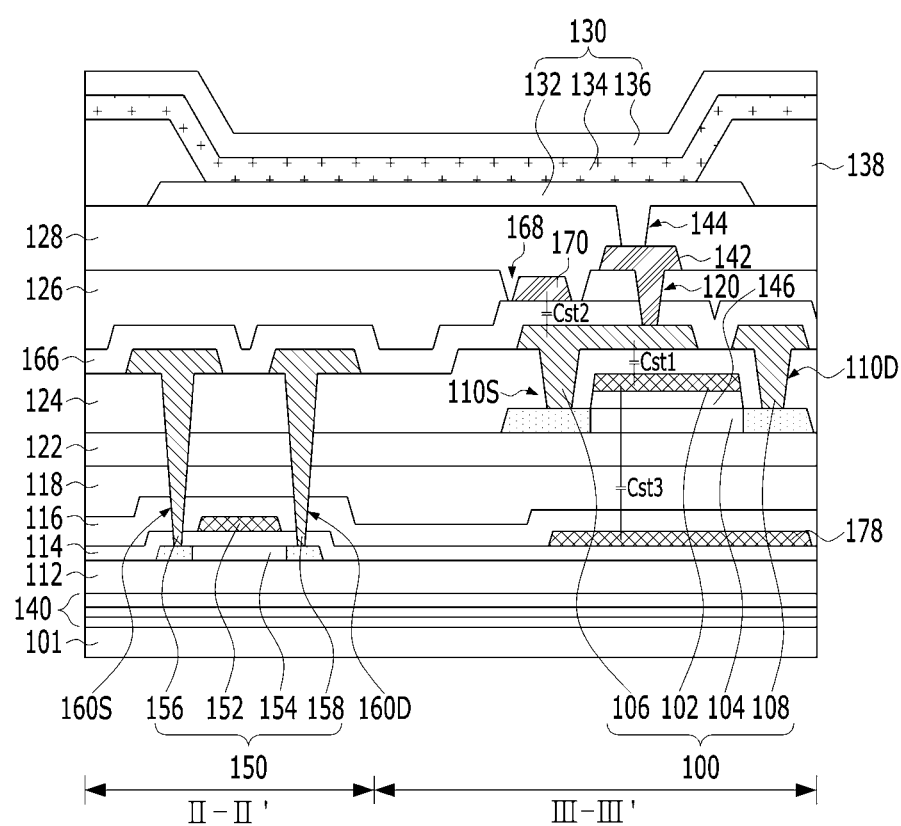

Alternatively, as shown in FIGS. 8A to 8C, the storage capacitor Cst may include two or more storage capacitors, which are connected in parallel.

The storage capacitor Cst shown in FIG. 8A includes a first storage capacitor Cst1 and a second storage capacitor Cst2, which are connected in parallel.

The first storage capacitor Cst1 is formed in a manner such that the gate electrode 102 of the driving transistor and the source electrode 106 of the driving transistor overlap each other with the upper interlayer insulation film 124 interposed between.

The second storage capacitor Cst2 is formed in a manner such that a light-shielding layer 178 and the gate electrode 102 of the driving transistor overlap each other with the first lower interlayer insulation film 116, the second lower interlayer insulation film 118, and the upper buffer layer 122 interposed between. The light-shielding layer 178 is electrically connected to the source electrode 106 of the driving transistor.

Accordingly, the first storage capacitor Cst1 and the second storage capacitor Cst2 are connected in parallel such that one end of each of the first and second storage capacitors Cst1 and Cst2 is connected to the gate electrode 102 of the driving transistor and the opposite end thereof is connected to the source electrode 106 of the driving transistor. As a result, the total capacitance of the storage capacitor shown in FIG. 8A may become greater than the total capacitance of the storage capacitor shown in FIG. 7.

The storage capacitor shown in FIG. 8B includes a first storage capacitor Cst1 and a second storage capacitor Cst2, which are connected in parallel.

The first storage capacitor Cst1 is formed in a manner such that the second gate electrode 102 and the second source electrode 106 overlap each other with the upper interlayer insulation film 124 interposed therebetween.

The second storage capacitor Cst2 is formed in a manner such that a storage electrode 170 and the second source electrode 106 overlap each other with a protective film 166 interposed therebetween. At this time, the storage electrode 170 is electrically connected to the second gate electrode 102.

The storage electrode 170 is disposed on the portion of the protective film 166 that is exposed through a storage hole 168, and therefore overlaps the second source electrode 106 with only the protective film 166 interposed therebetween. The storage electrode 170 is formed of the same material as a pixel connection electrode 142. The second storage capacitor Cst2 shown in FIG. 8B, in which the storage electrode 170 and the second source electrode 106 overlap each other with the single-layered protective film 166 interposed therebetween, has a greater capacitance than the second storage capacitor Cst2 shown in FIG. 8A, in which the second gate electrode 102 and the light-shielding layer 178 overlap each other with the two- or more-layered insulation films 116, 118 and 122 interposed therebetween.

As a result, the total capacitance of the storage capacitor shown in FIG. 8B may become greater than the total capacitance of the storage capacitor shown in FIG. 8A.

The storage capacitor shown in FIG. 8C includes a first storage capacitor Cst1, a second storage capacitor Cst2, and a third storage capacitor Cst3, which are connected in parallel.

The first storage capacitor Cst1 is formed in a manner such that the second gate electrode 102 and the second source electrode 106 overlap each other with the upper interlayer insulation film 124 interposed therebetween.

The second storage capacitor Cst2 is formed in a manner such that the storage electrode 170 and the second source electrode 106 overlap each other with the protective film 166 interposed therebetween. The storage electrode 170 is electrically connected to the second gate electrode 102. The storage electrode 170 is disposed on the portion of the protective film 166 that is exposed through the storage hole 168, and therefore overlaps the second source electrode 106 with only the protective film 166 interposed therebetween.

The third storage capacitor Cst3 is formed in a manner such that the light-shielding layer 178 and the second gate electrode 102 overlap each other with the first lower interlayer insulation film 116, the second lower interlayer insulation film 118, and the upper buffer layer 122 interposed therebetween. At this time, the light-shielding layer 178 is electrically connected to the second source electrode 106.

Accordingly, the first to third storage capacitors Cst1, Cst2 and Cst3 are connected in parallel such that one end of each of the first to third storage capacitors Cst1, Cst2 and Cst3 is connected to the second gate electrode 102 and the opposite end thereof is connected to the second source electrode 106. As a result, the total capacitance of the storage capacitor shown in FIG. 8C may become greater than the total capacitance of the storage capacitor shown in FIG. 7.

The light-emitting element 130 includes an anode 132, which is connected to the second source electrode 106 of the second thin-film transistor 100, at least one light-emitting stack 134, which is formed on the anode 132, and a cathode 136, which is formed on the light-emitting stack 134.

The anode 132 is connected to the pixel connection electrode 142, which is exposed through a second pixel contact hole 144 that penetrates a planarization layer 128. The pixel connection electrode 142 is connected to the second source electrode 106, which is exposed through a first pixel contact hole 120 that penetrates the protective film 166 and a first planarization layer 126.

The anode 132 is formed in a multi-layer structure including a transparent conductive film and an opaque conductive film having high reflection efficiency. The transparent conductive film is formed of a material having a relatively high work function, e.g. indium-tin-oxide (ITO) or indium-zinc-oxide (IZO), and the opaque conductive film is formed in a single-layer or multi-layer structure including any one selected from the group consisting of Al, Ag, Cu, Pb, Mo, and Ti, or an alloy thereof. For example, the anode 132 may be formed in a structure such that a transparent conductive film, an opaque conductive film and a transparent conductive film are sequentially stacked, or such that a transparent conductive film and an opaque conductive film are sequentially stacked. The anode 132 is disposed on the second planarization layer 128 so as to overlap the light emission region provided by a bank 138 as well as the circuit region in which the first and second transistors 150 and 100 and the storage capacitor Cst (180) are disposed, whereby the light emission area is increased.

The light-emitting stack 134 is formed by stacking, on the anode 132, a hole-related layer, an organic emission layer, and an electron-related layer, either in that order or in the reverse order. In addition, the light-emitting stack 134 may include first and second light-emitting stacks, which face each other with a charge generation layer interposed between. In this case, an organic emission layer of any one of the first and second light-emitting stacks generates blue light, and an organic emission layer of the remaining one of the first and second light-emitting stacks generates yellow-green light, with the result that white light is generated via the first and second light-emitting stacks. Since the white light generated from the light-emitting stack 134 is introduced into a color filter (not shown) disposed on the light-emitting stack 134, a color image may be realized. Alternatively, it may be possible to realize a color image in a manner such that each light-emitting stack 134 generates colored light corresponding to each sub-pixel without a separate color filter. That is, a light-emitting stack 134 of a red (R) sub-pixel may generate red light, a light-emitting stack 134 of a green (G) sub-pixel may generate green light, and a light-emitting stack 134 of a blue (B) sub-pixel may generate blue light.

The bank 138 may be formed so as to expose the anode 132. The bank 138 may be formed of an opaque material (e.g. a black material) in order to prevent optical interference between neighboring sub-pixels. In this case, the bank 138 includes a light-blocking material formed of at least one selected from among a color pigment, organic black and carbon materials.

The cathode 136 is formed on the top surface and the side surfaces of the light-emitting stack 134 so as to face the anode 132 with the light-emitting stack 134 interposed therebetween. In the case in which the cathode 136 is applied to a top-emission-type organic light-emitting display device, the cathode 136 is a transparent conductive film formed of, for example, indium-tin-oxide (ITO) or indium-zinc-oxide (IZO).

The cathode 136 is electrically connected with the low potential supply line 162. As shown in FIGS. 5B and 6, the low potential supply line 162 includes the first low potential supply line 162a and the second low potential supply lines 162b, which intersect each other. As shown in FIG. 7, the first low potential supply line 162a is formed in the same plane as the second gate electrode 102, that is, is formed on the upper gate insulation pattern 146 using the same material as the second gate electrode 102. The second low potential supply line 162b is formed in the same plane as the pixel connection electrode 142, that is, is formed on the first planarization layer 126 using the same material as the pixel connection electrode 142. The second low potential supply line 162b is electrically connected to the first low potential supply line 162a, which is exposed through a first line contact hole 164 that penetrates the upper interlayer insulation film 124, the protective film 166, and the first planarization layer 126.

As shown in FIGS. 5B and 6, the high potential supply line 172, which supplies high potential voltage VDD that is higher than the low potential voltage VSS supplied through the low potential supply line 162, includes the first high potential supply line 172a and the second high potential supply lines 172b, which intersect each other. The first high potential supply line 172a, as shown in FIG. 7, is formed in the same plane as the second gate electrode 102, that is, is formed on the upper gate insulation pattern 146 using the same material as the second gate electrode 102. The second high potential supply line 172b is formed in the same plane as the second source electrode 106 and the second drain electrode 108, that is, is formed on the upper interlayer insulation film 124 using the same material as the second source electrode 106 and the second drain electrode 108. The second high potential supply line 172b is electrically connected with the first high potential supply line 172a, which is exposed through a second line contact hole 174 that penetrates the upper interlayer insulation film 124. The second high potential supply line 172b overlaps the second low potential supply line 162b with the protective film 166 and the first planarization layer 126 interposed therebetween. At this time, even when a pinhole is formed in the first planarization layer 126 formed of an organic insulation material, the protective film 166 formed of an inorganic insulation material may prevent short-circuiting of the second high potential supply line 172b and the second low potential supply line 162b.

As shown in FIG. 7, a signal link 176, which is connected to at least one of the low potential supply line 162, the high potential supply line 172, the data line DL, the scan line SL, or the light emission control line EL, is disposed across the bending area BA, in which first and second openings 192 and 194 are formed. The first opening 192 exposes the side surface of the upper interlayer insulation film 124 and the top surface of the upper buffer layer 122. The first opening 192 is formed so as to have a depth d1 equal to the depth of at least one of the second source contact hole 110S or the second drain contact hole 110D. The second opening 194 exposes the side surface of each of the multi-buffer layer 140, the lower buffer layer 112, the lower gate insulation film 114, the first lower interlayer insulation film 116, the second lower interlayer insulation film 118, and the upper buffer layer 122. The second opening 194 is formed so as to have a depth d2 greater than or equal to the depth of at least one of the first source contact hole 160S or the first drain contact hole 160D. Accordingly, the multi-buffer layer 140, the lower buffer layer 112, the lower gate insulation film 114, the first lower interlayer insulation film 116, the second lower interlayer insulation film 118, the upper buffer layer 122, and the upper interlayer insulation film 124 are eliminated from the bending area BA through the first and second openings 192 and 194. As a result of elimination of a plurality of inorganic insulation layers 140, 112, 114, 116, 118, 122 and 124, which cause cracks, from the bending area BA, it is possible to easily bend the substrate 101 without forming cracks.

The signal link 176, which is disposed in the bending area BA, as shown in FIG. 7, may be formed together with the pixel connection electrode 142 through the same mask process. In this case, the signal link 176 is formed in the same plane as the pixel connection electrode 142 using the same material, that is, is formed on the first planarization layer 126 and the substrate 101. In order to cover the signal link 176 formed on the first planarization layer 126 and the substrate 101, the second planarization layer 128 is disposed on the signal link 176. Alternatively, instead of the second planarization layer 128, an encapsulation film or an inorganic encapsulation layer of an encapsulation stack, which is embodied by a combination of inorganic and organic encapsulation layers, is disposed on the signal link 176.

Figure 9A:
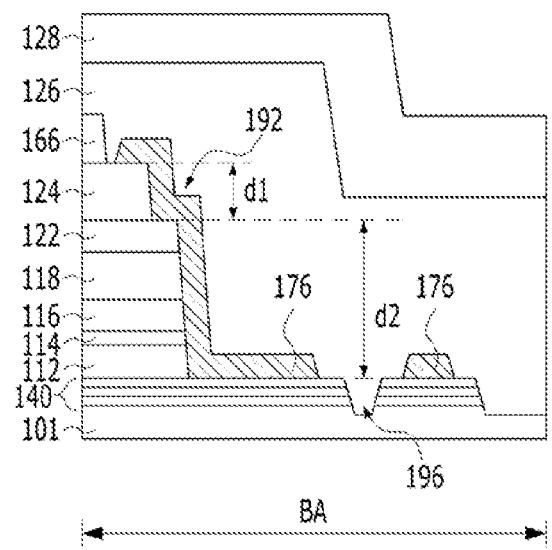
FIGS. 9A and 9B are cross-sectional views illustrating other embodiments of the bending area shown in FIG. 7.
Figure 9B:
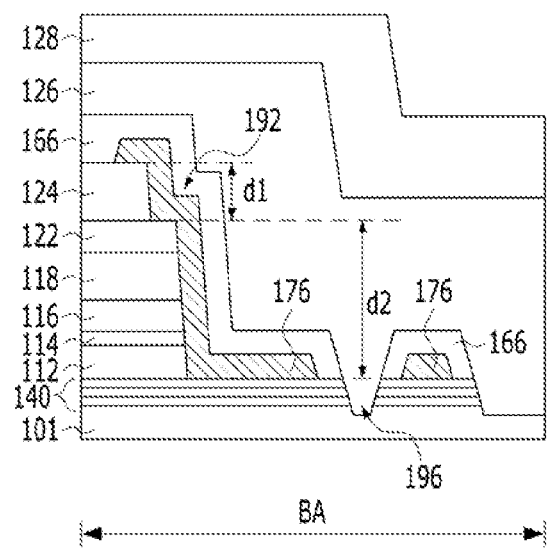

As shown in FIGS. 9A and 9B, the signal link 176 may be formed together with the source and drain electrodes 106, 156, 108 and 158 through the same mask process. In this case, the signal link 176 is formed in the same plane as the source and drain electrode 106, 156, 108 and 158 using the same material, that is, is formed on the upper interlayer insulation film 124, and is also formed on the substrate 101 so as to be brought into contact with the substrate 101. At this time, the signal link 176 is formed on the side surface of the upper interlayer insulation film 124 and the top surface of the upper buffer layer 122, which are exposed by the first opening 192, and is also formed on the side surfaces of the multi-buffer layer 140, the lower buffer layer 112, the lower gate insulation film 114, the first lower interlayer insulation film 116, the second lower interlayer insulation film 118, and the upper buffer layer 122, which are exposed by the second opening 194. Therefore, the signal link 176 is formed in a step shape. In order to cover the signal link 176 formed in a step shape, at least one of the first planarization layer 126 or the second planarization layer 128 is disposed on the signal link 176. Alternatively, instead of the first and second planarization layers 126 and 128, an encapsulation film or an inorganic encapsulation layer of an encapsulation stack, which is embodied by a combination of inorganic and organic encapsulation layers, is disposed on the signal link 176.

As shown in FIGS. 9A and 9B, the signal link 176 may be disposed on the multi-buffer layer 140. At this time, a portion of the multi-buffer layer 140, which is located between the signal links 176, is eliminated so as to facilitate bending without forming cracks, with the result that a trench 196, through which the substrate 101 is exposed, is formed between the signal links 176.

The trench 196 shown in FIG. 9A is formed so as to pass throughout a portion of the multi-buffer layer 140 and to extend to a predetermined depth in a portion of the substrate 101 at a location between the signal links 176. The first and second planarization layers 126 and 128 are disposed on the signal links 176. The trench 196 shown in FIG. 9B is formed so as to pass throughout a portion of the protective film 166 and a portion of the multi-buffer layer 140 and to extend to a predetermined depth in a portion of the substrate 101 at a location between the signal links 176. The protective film 166 and the first and second planarization layers 126 and 128 are disposed on the signal links 176. At least one moisture-blocking hole (not shown) may be formed in the bending area BA so as to penetrate the first and second planarization layers 126 and 128. The moisture-blocking hole is formed in at least one of the region between the signal links 176 or the upper portions of the signal links 176. The moisture-blocking hole prevents external moisture from permeating the active area AA through at least one of the first planarization layer 126 or the second planarization layer 128 disposed on the signal link 176. An inspection line (not shown) for use in an inspection process is formed in the bending area BA so as to have the same structure as one of the signal links 176 shown in FIGS. 7, 9A and 9B.

As described above, the multi-buffer layer 140, the lower buffer layer 112, the lower gate insulation film 114, the first lower interlayer insulation film 116, the second lower interlayer insulation film 118, the upper buffer layer 122, and the upper interlayer insulation film 124 are eliminated from the bending area BA through the first opening 192 and second opening 194. As a result of elimination of a plurality of inorganic insulation layers 140, 112, 114, 116, 118, 122 and 124, which cause cracks, from the bending area BA, it is possible to easily bend the substrate 101 without forming cracks in the bending area BA.

FIGS. 10A to 10M are cross-sectional views for explaining the method of manufacturing the organic light-emitting display device shown in FIG. 7.

Figure 10A:
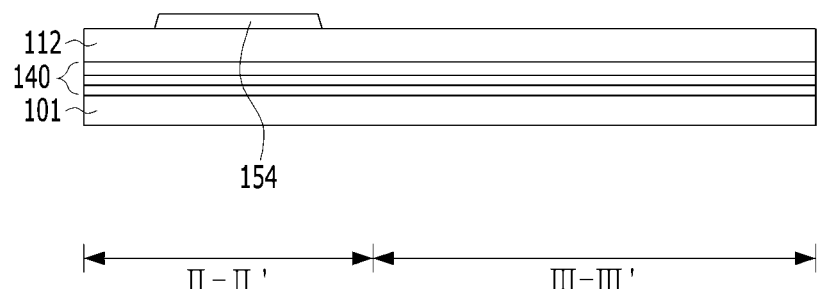
FIGS. 10A to 10M are cross-sectional views for explaining a method of manufacturing the organic light-emitting display device shown in FIG. 7.
Figure 10A:
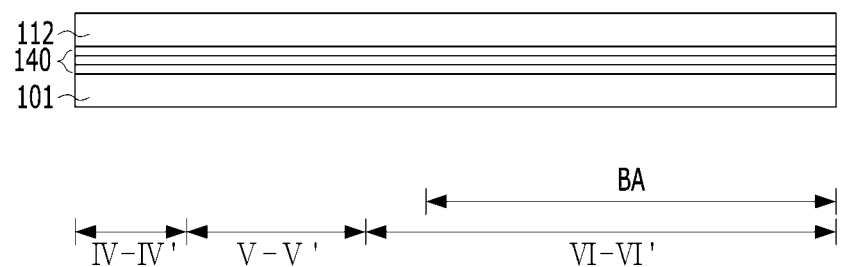

Referring to FIG. 10A, the multi-buffer layer 140, the lower buffer layer 112, and the polycrystalline semiconductor layer 154 are sequentially formed on the substrate 101.

Specifically, the multi-buffer layer 140 is formed in a manner such that silicon oxide (SiOx) and silicon nitride (SiNx) are stacked alternately at least once on the substrate 101. Subsequently, the lower buffer layer 112 is formed in a manner such that SiOx or SiNx is deposited on the entirety of the surface of the multi-buffer layer 140. Subsequently, an amorphous silicon thin film is formed on the substrate 101, on which the lower buffer layer 112 has been formed, through a low-pressure chemical vapor deposition (LPCVD) or plasma-enhanced chemical vapor deposition (PECVD) method. Subsequently, a polycrystalline silicon thin film is formed by crystallizing the amorphous silicon thin film. Subsequently, the polycrystalline silicon thin film is patterned through a photolithography process and an etching process using a first mask so as to form the polycrystalline semiconductor layer 154.

Figure 10B:
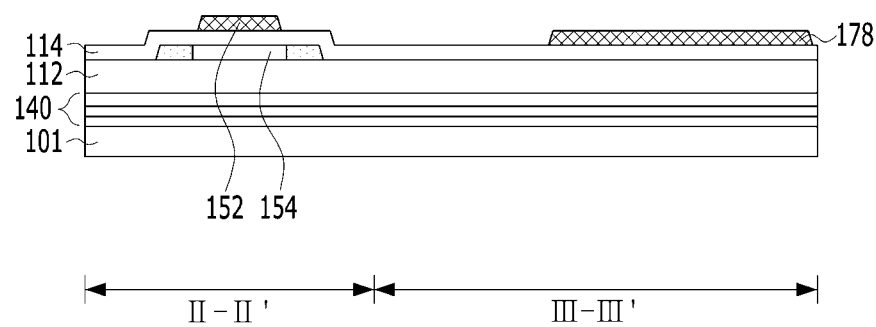
Figure 10B:
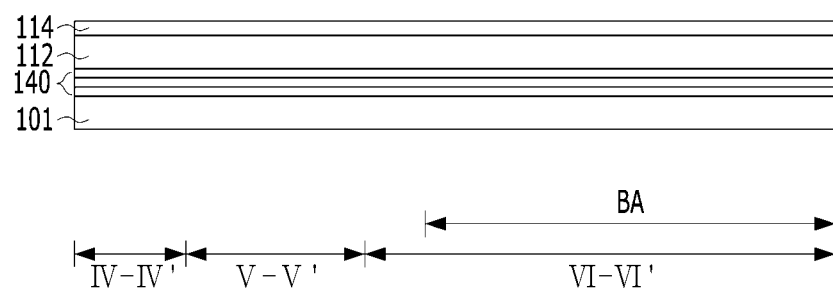

Referring to FIG. 10B, the gate insulation film 114 is formed on the substrate 101, on which the polycrystalline semiconductor layer 154 has been formed, and the first gate electrode 152 and the light-shielding layer 178 are formed on the gate insulation film 114.

Specifically, the gate insulation film 114 is formed in a manner such that an inorganic insulation material such as SiNx or SiOx is deposited on the entirety of the surface of the substrate 101, on which the polycrystalline semiconductor layer 154 has been formed. Subsequently, a first conductive layer is deposited on the entirety of the surface of the gate insulation film 114 and is then patterned through a photolithography process and an etching process using a second mask so as to form the first gate electrode 152 and the light-shielding layer 178. Subsequently, the polycrystalline semiconductor layer 154 is doped with impurities through a doping process using the first gate electrode 152 as a mask, thereby forming the source and drain regions, which do not overlap the first gate electrode 152, and the channel region, which overlaps the first gate electrode 152.

Figure 10C:
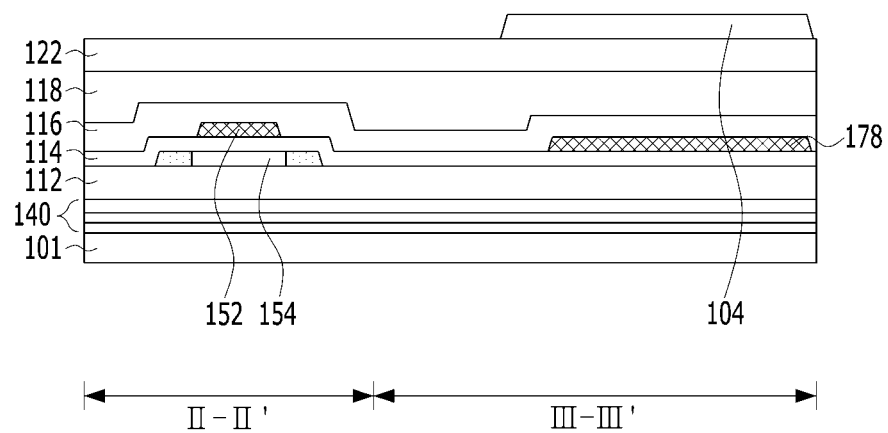
Figure 10C:
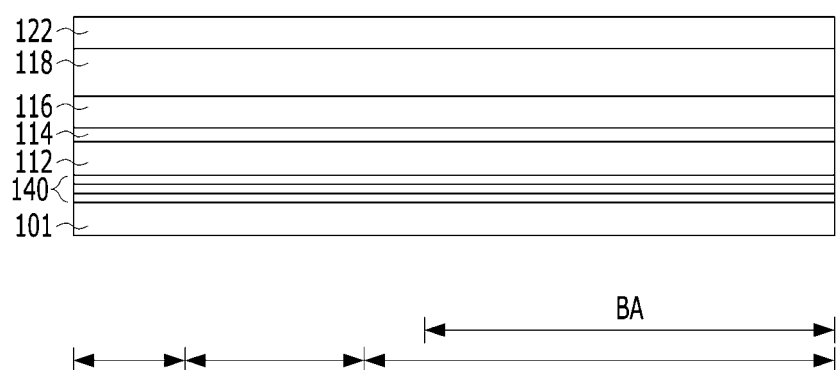

Referring to FIG. 10C, at least one layered first lower interlayer insulation film 116, at least one layered second lower interlayer insulation film 118 and the upper buffer layer 122 are sequentially formed on the substrate 101, on which the first gate electrode 152 and the light-shielding layer 178 have been formed. The oxide semiconductor layer 104 is formed on the upper buffer layer 122.

Specifically, the first lower interlayer insulation film 116 is formed in a manner such that an inorganic insulation material such as SiNx or SiOx is deposited on the entirety of the surface of the substrate 101, on which the first gate electrode 152 and the light-shielding layer 178 have been formed. The second lower interlayer insulation film 118 is formed in a manner such that an inorganic insulation material such as SiNx or SiOx is deposited on the entirety of the surface of the first lower interlayer insulation film 116. Subsequently, the upper buffer layer 122 is formed in a manner such that an inorganic insulation material such as SiNx or SiOx is deposited on the entirety of the surface of the second lower interlayer insulation film 118. Subsequently, the oxide semiconductor layer 104 is deposited on the entirety of the surface of the upper buffer layer 122, and is then patterned through a photolithography process and an etching process using a third mask so as to form the oxide semiconductor layer 104, which overlaps the light-shielding layer 178.

Figure 10D:
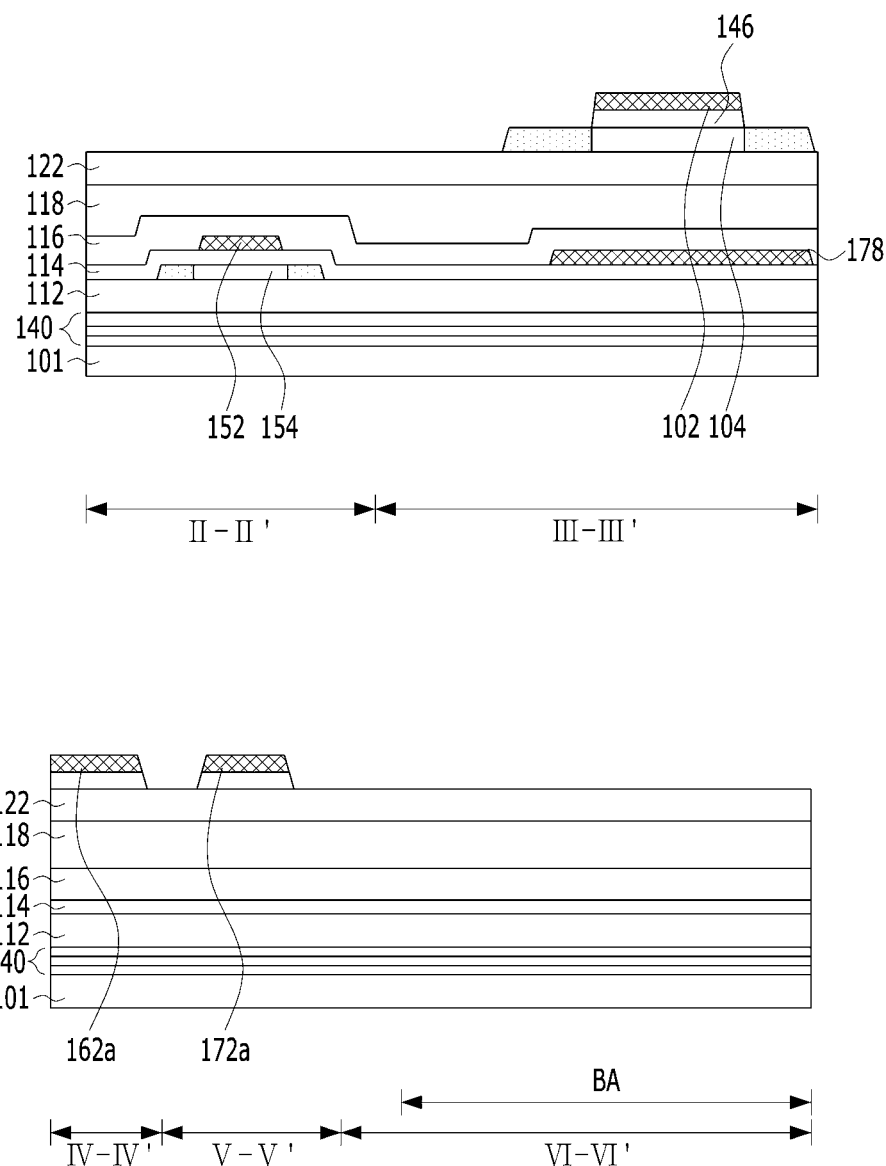

Referring to FIG. 10D, the upper gate insulation pattern 146, the second gate electrode 102, the first low potential supply line 162a, and the first high potential supply line 172a are formed on the substrate 101, on which the oxide semiconductor layer 104 has been formed.

Specifically, the upper gate insulation film is formed on the substrate 101, on which the oxide semiconductor layer 104 has been formed, and a third conductive layer is formed through a deposition method such as sputtering. The upper gate insulation film is formed of an inorganic insulation material such as SiOx or SiNx. The third conductive layer may have a single-layer structure or a multi-layer structure, and may be formed of a metal material such as, for example, Mo, Ti, Cu, AlNd, Al, or Cr, or an alloy thereof. Subsequently, the third conductive layer and the upper gate insulation film are patterned at the same time through a photolithography process and an etching process using a fourth mask, with the result that the upper gate insulation pattern 146 is formed under each of the second gate electrode 102, the first low potential supply line 162a, and the first high potential supply line 172a so as to have the same pattern as each of the second gate electrode 102, the first low potential supply line 162a, and the first high potential supply line 172a. At this time, during the dry etching of the upper gate insulation film, the oxide semiconductor layer 104, which does not overlap the second gate electrode 102, is exposed by plasma, and oxygen in the oxide semiconductor layer 104 exposed by plasma is eliminated through reaction to plasma gas. Accordingly, the oxide semiconductor layer 104, which does not overlap the second gate electrode 102, becomes conductive and becomes the source and drain regions.

Figure 10E:
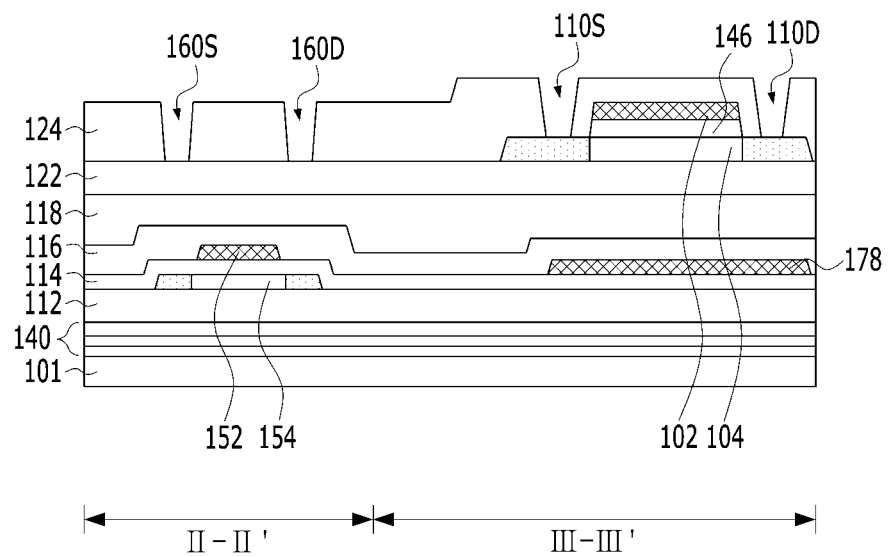
Figure 10E:
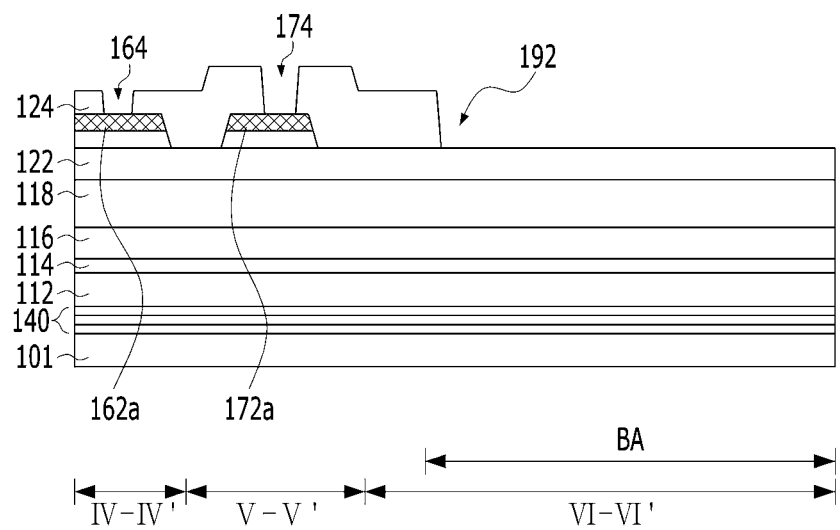

Referring to FIG. 10E, the upper interlayer insulation film 124, which has the first opening 192, the first source contact hole 160s and the second source contact hole 110S, the first drain contact hole 160D and the second drain contact holes 110D and the first line contact hole 165 and the second line contact hole 174, is formed on the substrate 101, on which the upper gate insulation pattern 146, the second gate electrode 102, the first low potential supply line 162a and the first high potential supply line 172a have been formed.

Specifically, the upper interlayer insulation film 124 is formed in a manner such that an inorganic insulation material such as SiNx or SiOx is deposited on the entirety of the surface of the substrate 101, on which the upper gate insulation pattern 146, the second gate electrode 102 and the first high potential supply line 172 have been formed. Subsequently, the upper interlayer insulation film 124 is patterned through a photolithography process and an etching process using a fifth mask so as to form the first source contact hole 160s and the second source contact hole 110S, the first drain contact hole 160D and the second drain contact holes 110D, and the first line contact hole 165 and the second line contact hole 174. At the same time, the upper interlayer insulation film 124 is eliminated from the bending area BA so as to form the first opening 192. The first source contact hole 160s and the second source contact hole 110S, the first drain contact hole 160D and the second drain contact holes 110D, the first line contact hole 165 and the second line contact hole 174, and the first opening 192 are formed so as to penetrate the upper interlayer insulation film 124. Accordingly, the first opening 192 has a depth equal to the depth of at least one of the first source contact hole 160S, the second source contact hole 110S, the first drain contact hole 160D, the second drain contact hole 110D, the first line contact hole 164, or the second line contact hole 174.

Figure 10F:
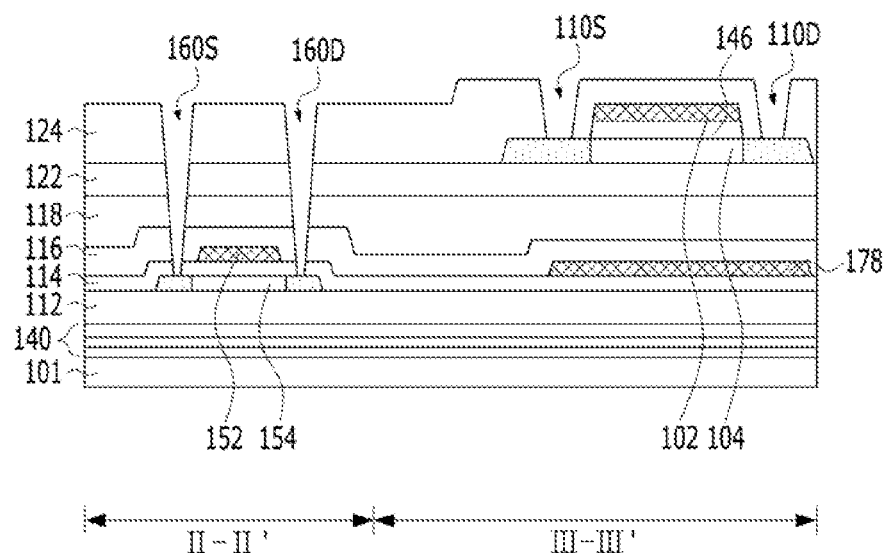
Figure 10F:
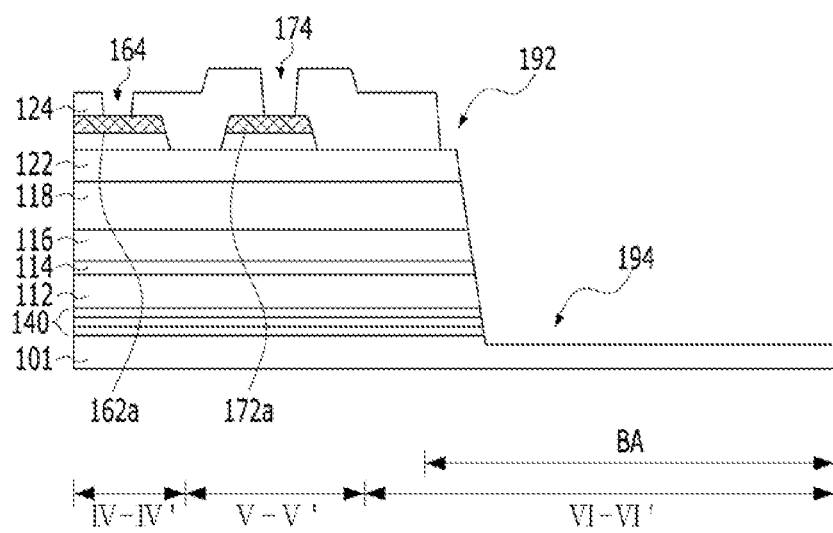

Referring to FIG. 10F, the second opening 194 is formed in the bending area BA on the substrate 101, on which the upper interlayer insulation film 124 has been formed. At the same time, the gate insulation film 114, the first lower interlayer insulation film 116 and second lower interlayer insulation film 118, and the upper buffer layer 122 are eliminated from the first source contact hole 160S and the first drain contact hole 160D.

Specifically, the lower gate insulation film 114, the first lower interlayer insulation film 116 and second lower interlayer insulation film 118, and the upper buffer layer 122 are eliminated from the first source contact hole 160S and the first drain contact hole 160D through an etching process, in which a photoresist pattern, which is formed on the substrate 101 on which the upper interlayer insulation film 124 has been formed through a photolithography process using a sixth mask, is used as a mask. At the same time, the multi-buffer layer 140, the lower buffer layer 112, the lower gate insulation film 114, the first lower interlayer insulation film 116 and second lower interlayer insulation film 118, and the upper buffer layer 122 are eliminated from the bending area BA so as to form the second opening 194. Upon the formation of the second opening 194, a portion of the substrate 101 may also be eliminated.

Figure 10G:
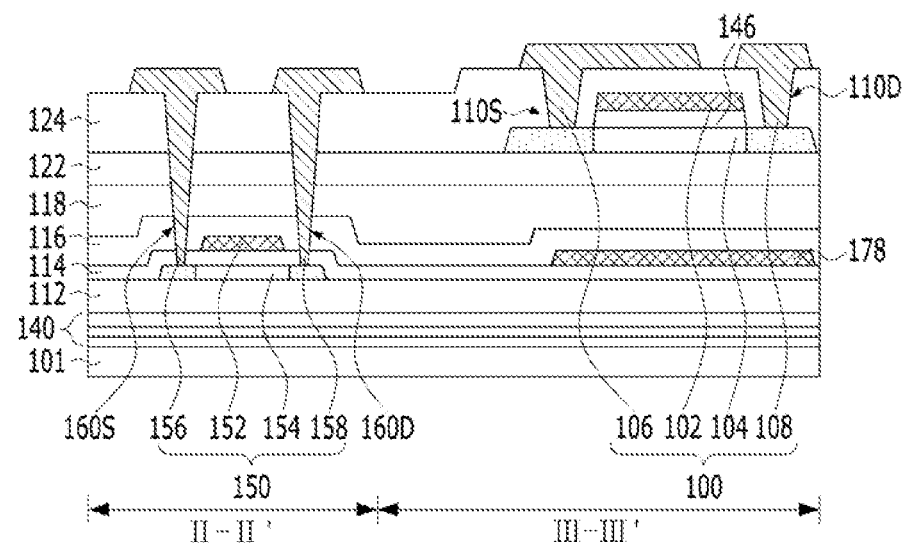
Figure 10G:
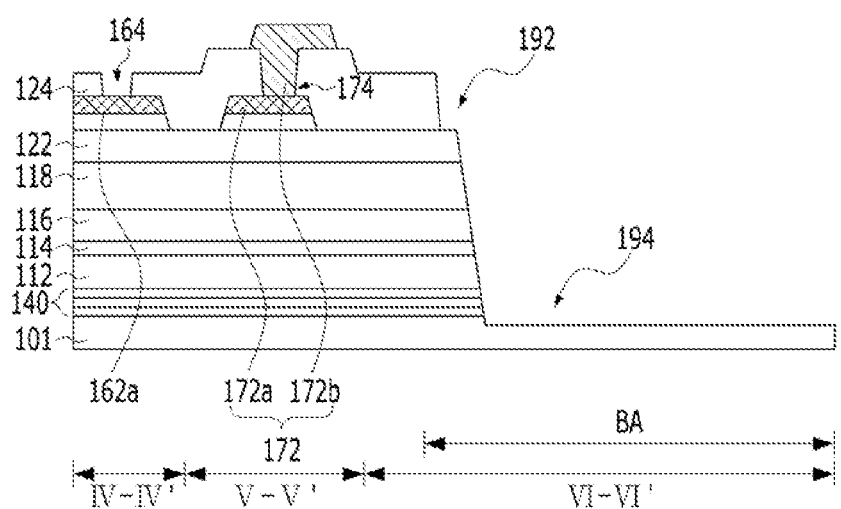

Referring to FIG. 10G, the first source electrode 156 and the second source electrode 106, the first drain electrode 158 and the second drain electrode 108, and the second high potential supply line 172b are formed on the substrate 101, on which the second opening 194 has been formed.

Specifically, a fourth conductive layer, which is formed of Mo, Ti, Cu, AlNd, Al or Cr, or an alloy thereof, is deposited on the entirety of the surface of the substrate 101, on which the second opening 194 has been formed. Subsequently, the fourth conductive layer is patterned through a photolithography process and an etching process using a seventh mask so as to form the first source electrode 156 and the second source electrode 106, the first drain electrode 158 and the second drain electrode 108, and the second high potential supply line 172b.

Figure 10H:
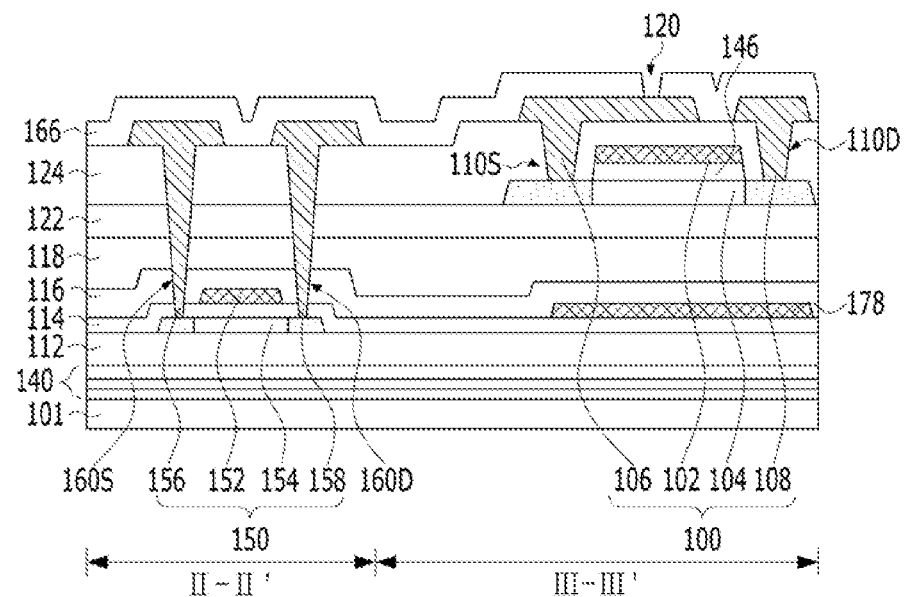
Figure 10H:
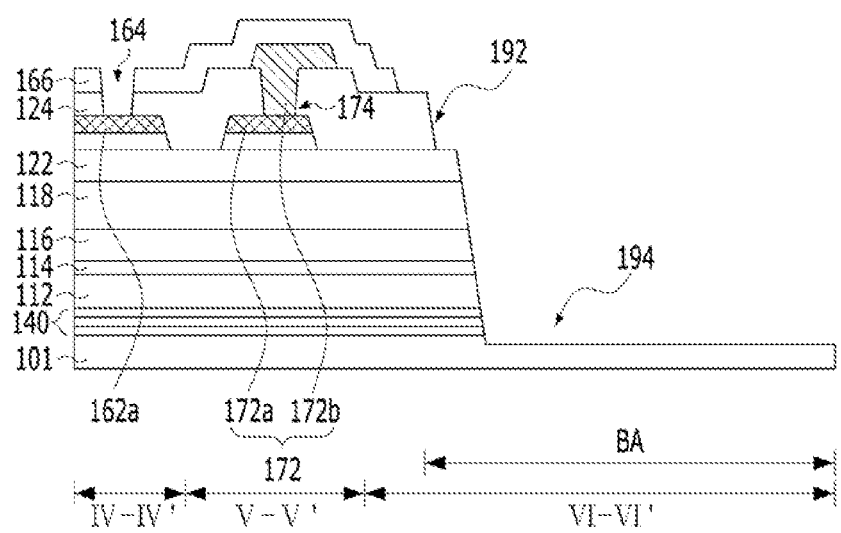

Referring to FIG. 10H, the protective film 166 having therein the first pixel contact hole 120 is formed on the substrate 101, on which the first source electrode 156 and the second source electrode 106, the first drain electrode 158 and the second drain electrode 108, and the second high potential supply line 172b have been formed.

Specifically, the protective film 166 is formed in a manner such that an inorganic insulation material such as SiNx or SiOx is deposited on the entirety of the surface of the substrate 101, on which the first source electrode 156 and the second source electrode 106, the first drain electrode 158 and the second drain electrode 108, and the second high potential supply line 172b have been formed. Subsequently, the protective film 166 is patterned through a photolithography process and an etching process using an eighth mask so as to form the pixel contact hole 120. At the same time, the protective film 166 is eliminated from the first line contact hole 164.

Figure 10I:
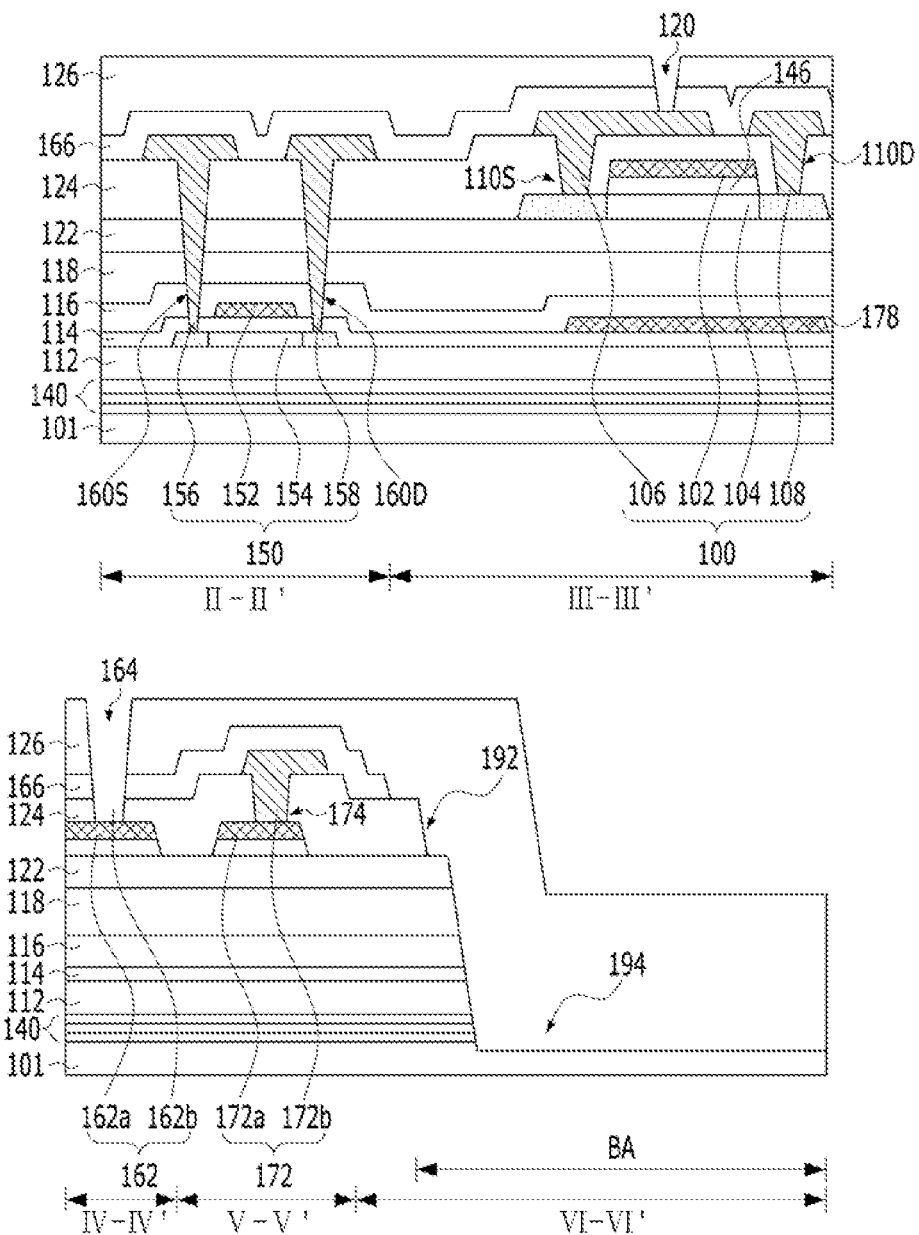

Referring to FIG. 10I, the first planarization layer 126 is formed on the substrate 101, on which the protective film 166 has been formed.

Specifically, the first planarization layer 126 is formed in a manner such that an organic insulation material such as acrylic resin is deposited on the entirety of the surface of the substrate 101, on which the protective film 166 has been formed. Subsequently, the first planarization layer 126 is eliminated from the first pixel contact hole 120 and the first line contact hole 164 through a photolithography process using a ninth mask. That is, the first pixel contact hole 120 and the first line contact hole 164 are formed so as to penetrate the first planarization layer 126.

Figure 10J:
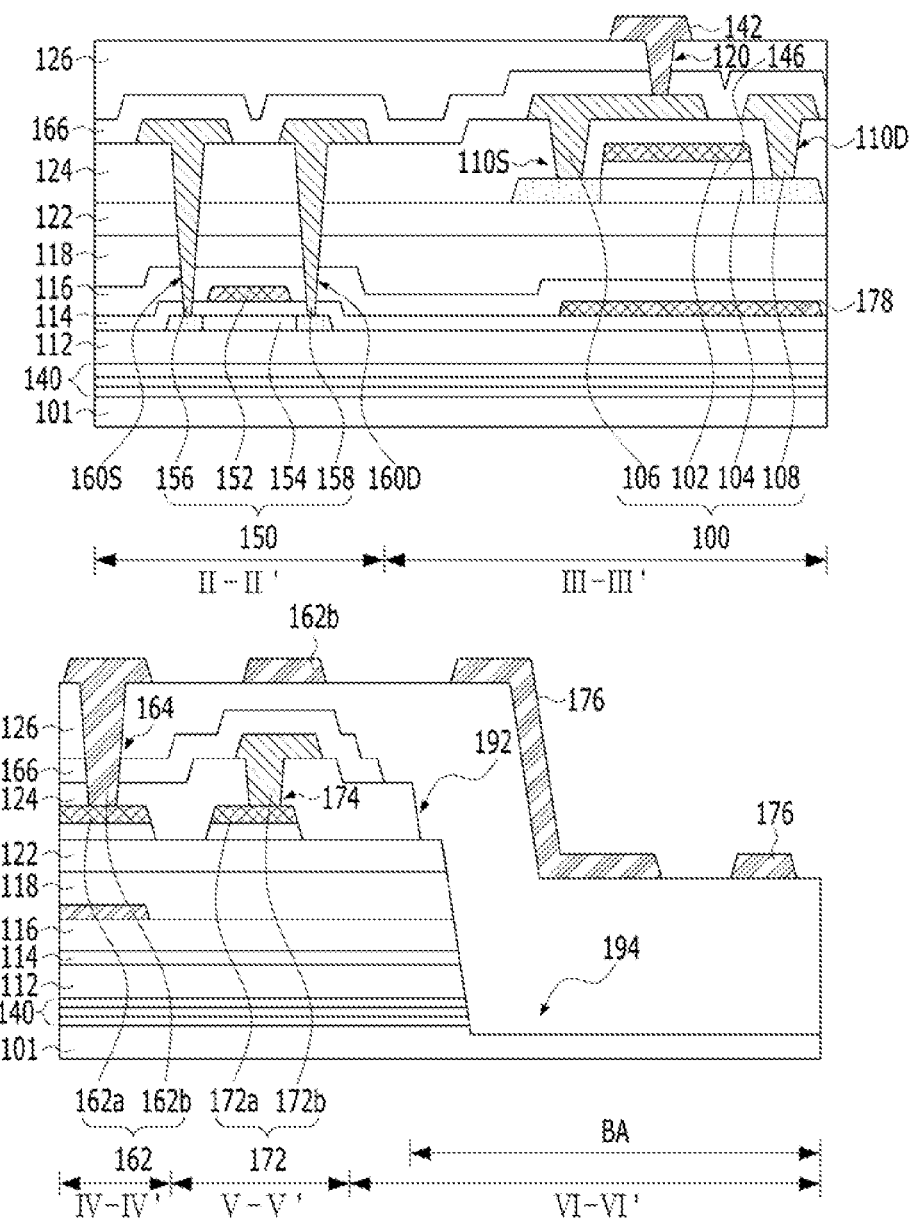

Referring to FIG. 10J, the pixel connection electrode 142, the second low potential supply line 162b, and the signal link 176 are formed on the substrate 101, on which the first planarization layer 126 has been formed.

Specifically, a fifth conductive layer, which is formed of Mo, Ti, Cu, AlNd, Al or Cr, or an alloy thereof, is deposited on the entirety of the surface of the substrate 101, on which the first planarization layer 126 has been formed. Subsequently, the fifth conductive layer is patterned through a photolithography process and an etching process using a tenth mask so as to form the pixel connection electrode 142, the second low potential supply line 162b and the signal link 176.

Figure 10K:
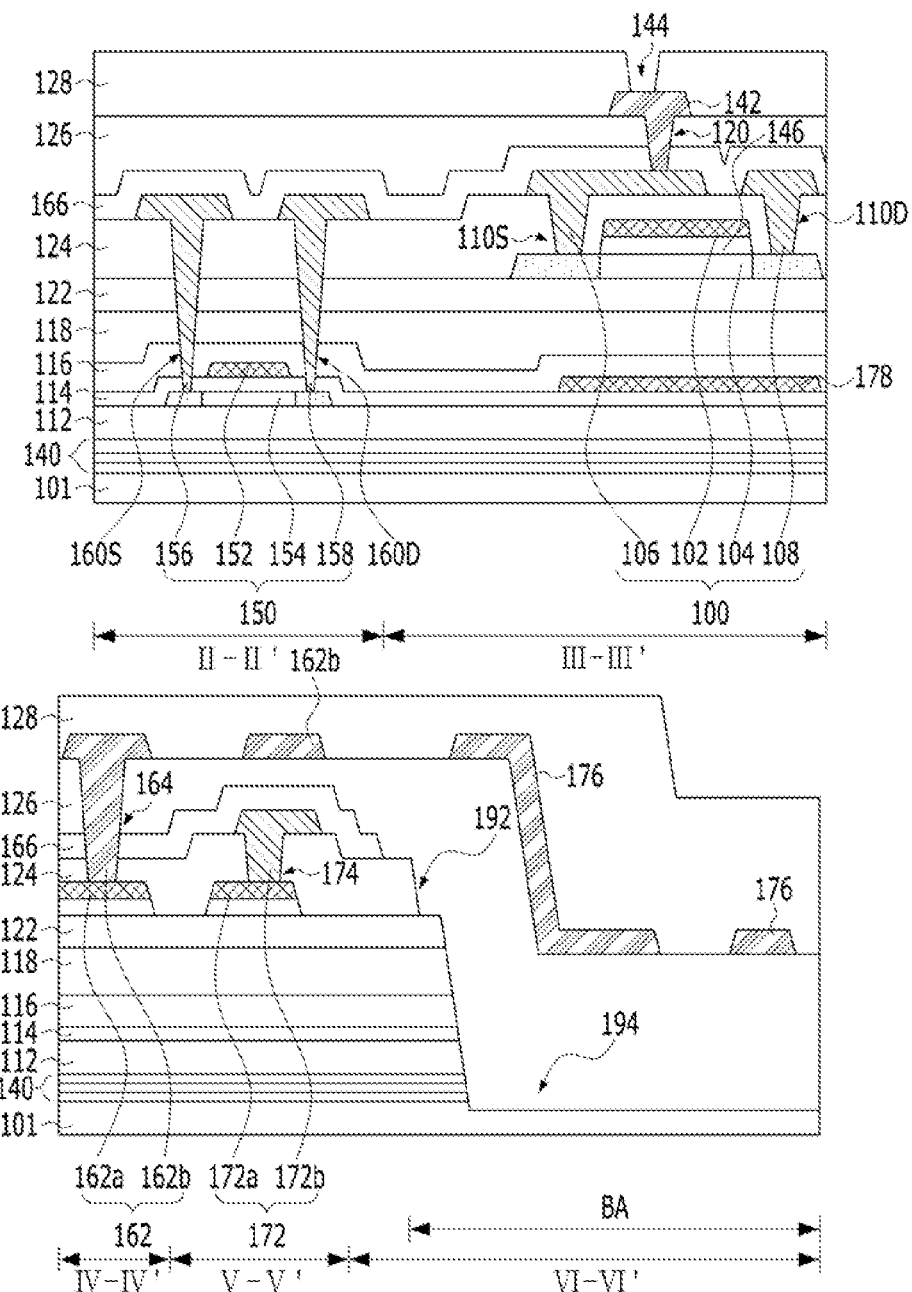

Referring to FIG. 10K, the second planarization layer 128 having therein the second pixel contact hole 144 is formed on the substrate 101, on which the pixel connection electrode 142, the second low potential supply line 162b, and the signal link 176 have been formed.

Specifically, the second planarization layer 128 is formed in a manner such that an organic insulation material such as acrylic resin is deposited on the entirety of the surface of the substrate 101, on which the pixel connection electrode 142, the second low potential supply line 162b, and the signal link 176 have been formed. Subsequently, the second planarization layer 128 is patterned through a photolithography process using an eleventh mask so as to form the second pixel contact hole 144.

Figure 10L:
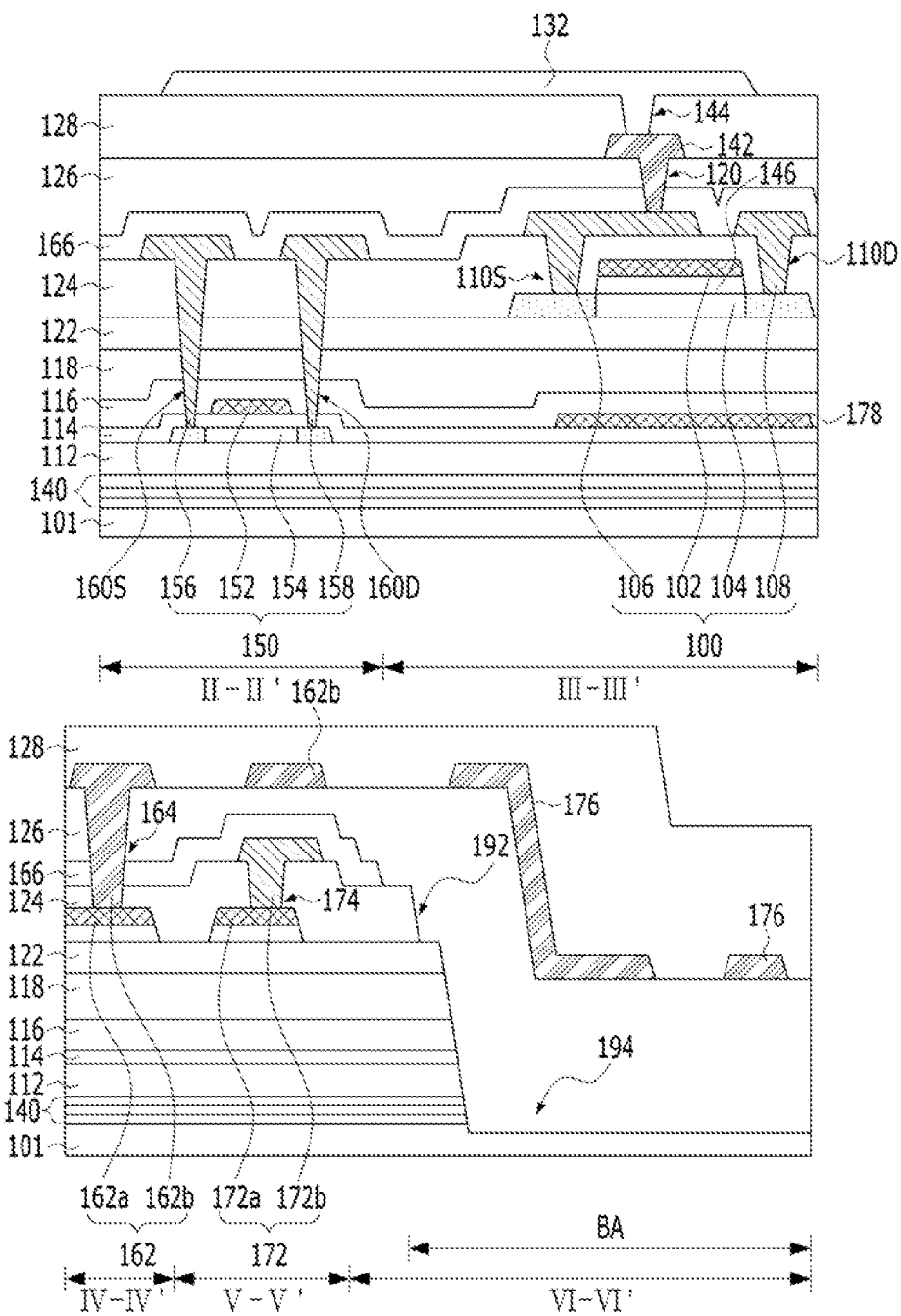

Referring to FIG. 10L, the anode 132 is formed on the substrate 101, on which the second planarization layer 128, having therein the second pixel contact hole 144, has been formed.

Specifically, a sixth conductive layer is deposited on the entirety of the surface of the substrate 101, on which the second planarization layer 128, having therein the second pixel contact hole 144, has been formed. A transparent conductive film and an opaque conductive film are used for the sixth conductive layer. Subsequently, the sixth conductive layer is patterned through a photolithography process and an etching process using a twelfth mask so as to form the anode 132.

Figure 10M:
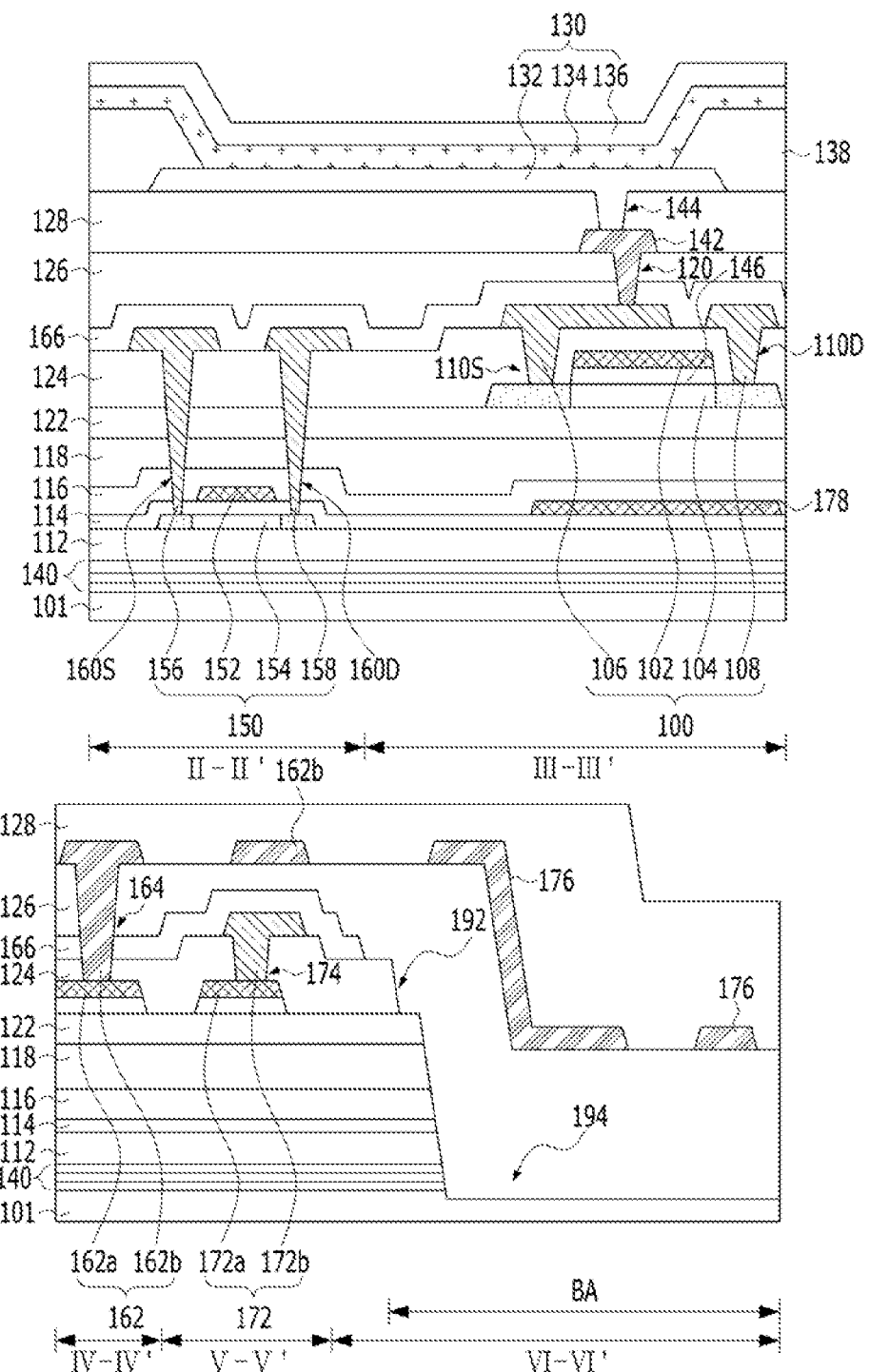

Referring to FIG. 10M, the bank 138, the organic light-emitting stack 134, and the cathode 136 are sequentially formed on the substrate 101, on which the anode 132 has been formed.

Specifically, a bank photosensitive film is applied on the entirety of the surface of the substrate 101, on which the anode 132 has been formed. Subsequently, the bank photosensitive film is patterned through a photolithography process using a thirteenth mask so as to form the bank 138. Subsequently, the light-emitting stack 134 and the cathode 136 are sequentially formed in the active area AA, rather than in the non-active area NA, through a deposition process using a shadow mask.

As described above, according to the present disclosure, the first opening 192 in the bending area and the second source and drain contact holes 110S and 110D are formed through the same single mask process, the second opening 194 in the bending area and the first source contact hole 160S and the first drain contact hole 160D are formed through the same single mask process, the first source electrode 156 and the first drain electrode 158 and the second source electrode 106 and the second drain electrode 108 are formed through the same single mask process, and the storage contact hole 188 and the first source contact hole 160S and the first drain contact hole 160D are formed through the same single mask process. In this way, the organic light-emitting display device according to the present disclosure may reduce the number of mask processes by a total of at least 4 compared to the related art, thereby simplifying the structure and manufacturing process of the device and consequently achieving enhanced productivity.

As is apparent from the above description, according to the present disclosure, a second thin-film transistor including an oxide semiconductor layer is applied to a driving transistor of each sub-pixel, and a first thin-film transistor including a polycrystalline semiconductor layer is applied to a switching transistor of each sub-pixel, whereby power consumption is reduced. Further, openings located in a bending area and a plurality of contact holes located in an active area are formed through the same mask process, and thus the openings and the contact holes are formed so as to have the same depth. Accordingly, the structure and manufacturing process of the device according to the present disclosure may be simplified, and productivity may therefore be enhanced. Further, according to the present disclosure, a protective film formed of an inorganic insulation material and a first planarization layer formed of an organic insulation material are disposed between a high potential supply line and a low potential supply line. Accordingly, even when a pinhole is formed in the first planarization layer, the protective film may prevent short-circuiting of the high potential supply line and the low potential supply line. Furthermore, according to the present disclosure, a first storage capacitor is formed in a manner such that a second source electrode of the second thin-film transistor and a second gate electrode of the second thin-film transistor overlap each other with an upper interlayer insulation film interposed between, or two or three storage capacitors are connected in parallel, leading to an increase in capacitance of the storage capacitors.

The invention claimed is:

1. A display device comprising:
    a substrate comprising an active area and a bending area;
    a first thin-film transistor disposed in the active area, the first thin-film transistor comprising a semiconductor layer, a first gate electrode, a first source electrode, and a first drain electrode;
    a second thin-film transistor disposed in the active area, the second thin-film transistor comprising a semiconductor layer, a second gate electrode, a second source electrode, and a second drain electrode;
    a plurality of insulating layers disposed between the substrate and the second thin-film transistor;
    at least one opening disposed in the bending area, the at least one opening exposing side surfaces of the plurality of insulating layers; and
    wherein a thickness of a portion of the substrate that overlaps the at least one opening is less than a thickness of a portion the substrate that is non-overlapping with the at least one opening.

2. The display device according to claim 1, wherein the plurality of insulating layers comprises:
    a lower interlayer insulation film and an upper buffer layer disposed between the semiconductor layer of the first thin film transistor and the semiconductor layer of the second thin film transistor.

3. The display device according to claim 2, further comprising:
    a light-shielding layer overlapping the semiconductor layer of the second thin film transistor.

4. The display device according to claim 3, wherein first gate electrode of the first thin film transistor is disposed in a same layer and is formed of a same material as the light-shielding layer.

5. The display device according to claim 3, wherein:
the upper buffer layer and the lower interlayer insulation film are disposed between the light-shielding layer and the semiconductor layer of the second thin film transistor.

6. The display device according to claim 2, wherein the upper buffer layer is formed of silicon oxide (SiOx), and the lower interlayer insulation film is formed of silicon nitride (SiNx).

7. The display device according to claim 5, wherein the first thin-film transistor comprises a polycrystalline semiconductor layer, and wherein the second thin-film transistor comprises an oxide semiconductor layer.

8. The display device according to claim 7, wherein the plurality of insulating layers further comprises:
an upper interlayer insulation film disposed between the oxide semiconductor layer and each of the second source electrode and the second drain electrode, and
a lower gate insulation film disposed between the polycrystalline semiconductor layer and the first gate electrode,
wherein the display device further comprises:
a protective film disposed so as to cover the first source electrode, the first drain electrode, the second source electrode and the second drain electrode,
wherein the second source electrode of the second thin-film transistor overlaps the second gate electrode of the second thin-film transistor with an upper interlayer insulation film interposed therebetween so as to form a first storage capacitor.

9. The display device according to claim 8, wherein the light-shielding layer overlaps the second gate electrode, with the lower interlayer insulation film and the upper buffer layer interposed therebetween so as to form a second storage capacitor,
wherein the first storage capacitor and the second storage capacitor are connected in parallel.

10. The display device according to claim 8, further comprising:
a storage electrode overlapping the second source electrode with the protective film interposed therebetween so as to form a third storage capacitor,
wherein the first storage capacitor and the third storage capacitor are connected in parallel.

11. The display device according to claim 10, further comprising:
the light-shielding layer overlapping the second gate electrode with the lower interlayer insulation film and the upper buffer layer interposed therebetween so as to form a fourth storage capacitor,
wherein the fourth storage capacitor is connected in parallel with the first storage capacitor and the third storage capacitor.

12. The display device according to claim 8, further comprising a plurality of contact holes disposed in the active area.

13. The display device according to claim 12, wherein the at least one opening has a depth equal to a depth of at least one of the contact holes.

14. The display device according to claim 12, wherein the plurality of contact holes comprises:
a first source contact hole and a first drain contact hole formed through the lower gate insulation film, the lower interlayer insulation film, the upper buffer layer, and the upper interlayer insulation film so as to expose the polycrystalline semiconductor layer;
a second source contact hole and a second drain contact hole formed through the upper interlayer insulation film so as to expose the oxide semiconductor layer; and
wherein the at least one opening comprises:
a first opening having a depth equal to a depth of each of the second source contact hole and the second drain contact hole, and
a second opening having a depth greater than a depth of each of the first source contact hole and the first drain contact hole.

15. The display device according to claim 14, wherein the plurality of insulating layers further comprises:
a multi-buffer layer disposed on the substrate; and
a lower buffer layer disposed on the multi-buffer layer,
wherein the first opening is formed through the upper interlayer insulation film in the bending area,
wherein the second opening is formed through the multi-buffer layer, the lower buffer layer, the lower gate insulation film, the lower interlayer insulation film, and the upper buffer layer in the bending area,
such that, in the bending area, the substrate is exposed by the at least one opening.

16. The display device according to claim 1, wherein the first source electrode and the first drain electrode of the first thin film transistor and the second source electrode and the second drain electrode of the second thin film transistor are disposed in a same plane and are formed of a same material.

17. The display device according to claim 1, wherein the first source electrode and the first drain electrode of the first thin film transistor, and the second source electrode and the second drain electrode of the second thin film transistor are disposed on the upper interlayer insulation film.

18. The display device according to claim 1, further comprising:
a high potential supply line connected with any one of the first thin-film transistor and the second thin-film transistor; and
a low potential supply line overlapping the high potential supply line with a protective film interposed therebetween.

19. The display device according to claim 18, further comprising:
an organic light-emitting element comprising an anode connected with the second thin-film transistor and a cathode connected with the low potential supply line,
wherein at least one of the low potential supply line and the high potential supply line is formed in a mesh shape.

20. The display device according to claim 18, further comprising:
a first planarization layer disposed on the upper interlayer insulation film;
a pixel connection electrode disposed on the first planarization layer, the pixel connection electrode being in contact with the second source electrode; and
a second planarization layer disposed so as to cover the pixel connection electrode.

21. The display device according to claim 20,
wherein a storage electrode is disposed on a portion of the protective film that is exposed by a storage hole formed through the first planarization layer,
wherein the storage electrode is formed of a same material as the pixel connection electrode.

22. The display device according to claim 20, wherein the low potential supply line comprises a first low potential supply line and a second low potential supply line that intersect each other, and wherein the high potential supply line comprises a first high potential supply line disposed parallel to the first low potential supply line and a second high potential supply line overlapping the second low potential supply line with the first planarization layer and the protective film interposed therebetween.

23. The display device according to claim 22, wherein the second low potential supply line is disposed in a same plane as the pixel connection electrode and is formed of a same material as the pixel connection electrode, and wherein the second high potential supply line is disposed in a same plane as the second source electrode and the second drain electrode and is formed of a same material as the second source electrode and the second drain electrode.

24. A display device comprising:
a substrate comprising an active area and a bending area;
a first thin-film transistor disposed in the active area, the first thin-film transistor comprising a semiconductor layer, a first gate electrode, a first source electrode, and a first drain electrode;
a second thin-film transistor disposed in the active area, the second thin-film transistor comprising a semiconductor layer, a second gate electrode, a second source electrode, and a second drain electrode;
a plurality of insulating layers disposed between the substrate and the second thin-film transistor;
at least one opening disposed in the bending area, the at least one opening exposing side surfaces of the plurality of insulating layers;
a first planarization layer disposed on the at least one opening, the first planarization layer contacting the side surfaces of the plurality of insulating layers exposed by the at least one opening; and
a signal link connected with a signal line disposed in the active area, the signal link being disposed in the bending area exposed by the at least one opening.

25. The display device according to claim 20, further comprising:
a signal link connected with a signal line disposed in the active area, the signal link being disposed in the bending area exposed by the at least one opening,
wherein the signal link is in contact with the substrate and is formed of a same material as the first source electrode and the second source electrode,
wherein the first planarization layer and the second planarization layer are disposed so as to cover the signal link.

26. The display device according to claim 24, wherein the signal link is disposed on the first planarization layer in the bending area that is exposed by the opening, the signal link being formed of a same material as the pixel connection electrode,
wherein the second planarization layer is disposed so as to cover the signal link.

27. The display device according to claim 19, further comprising:
a pixel-driving circuit for driving the organic light-emitting element, the pixel-driving circuit comprising:
the second thin-film transistor configured as a driving transistor; and
the first thin-film transistor configured as a switching transistor, the switching transistor being connected with the driving transistor.

28. The display device according to claim 27, wherein the pixel-driving circuit further comprises:
a second switching transistor, the second switching transistor being connected with the switching transistor; and
a third switching transistor, the third switching transistor being connected with the driving transistor.

* * * * *